United States Patent
Macoskey et al.

(10) Patent No.: US 11,686,650 B2
(45) Date of Patent: Jun. 27, 2023

(54) DYNAMIC SPATIOTEMPORAL BEAMFORMING

(71) Applicant: Robert Bosch GmbH, Stuttgart (DE)

(72) Inventors: Jonathan Jenner Macoskey, Pittsburgh, PA (US); Samarjit Das, Sewickley, PA (US)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/139,345

(22) Filed: Dec. 31, 2020

(65) Prior Publication Data

US 2022/0205874 A1 Jun. 30, 2022

(51) Int. Cl.
*G01M 99/00* (2011.01)
*G05D 1/00* (2006.01)
(Continued)

(52) U.S. Cl.
CPC .......... *G01M 99/005* (2013.01); *G01N 29/14* (2013.01); *G01R 29/0814* (2013.01);
(Continued)

(58) Field of Classification Search
CPC . G01M 99/005; G01N 29/14; G01R 29/0814; G05D 1/0094; G05D 2201/0207;
(Continued)

(56) References Cited

U.S. PATENT DOCUMENTS 9,434,069 B1 * 9/2016 Edsinger ................ B25J 9/1664
10,766,144 B2 * 9/2020 Casner ................. G05D 1/0231
(Continued)

FOREIGN PATENT DOCUMENTS

EP 2653944 A2 10/2013
WO 9504878 A1 2/1995
(Continued)

OTHER PUBLICATIONS

Peter L Scott, "Chapter 2 Uncertainty in Measurement: Noise and How to Deal With It", Physics 133 Lab Manual, pp. 5-25, 2015 https://scott.physics.ucsc.edu/pdf/133_draftman.pdf pp. 2-1 through 2-18 (Year: 2015).*

(Continued)

*Primary Examiner* — Catherine T. Rastovski
*Assistant Examiner* — Kaleria Knox
(74) *Attorney, Agent, or Firm* — Dickinson Wright PLLC

(57) ABSTRACT

A method for imaging a room by a controller includes requesting a signal, indicative of a measurement of a parameter, from a sensor associated with a position and direction of a mobile platform in the room, wherein the measurement from the sensor includes background noise, distortions, and a foreground signal of interest, in response to the mobile platform reaching a new position, requesting a second measurement of the parameter from the sensor associated with the new position of the mobile platform, spatially aggregating the signal from the sensor and associated position and direction to create an energy map via spatio-dynamic beamforming, wherein the background noise and distortions are reduced, by spatially averaging beamformed information acquired across multiple locations to synthesize signals indicative of the foreground signal of interest, analyzing the energy map to identify a state of an apparatus in the room, and outputting a foreground beamformed image.

17 Claims, 15 Drawing Sheets

(51) Int. Cl.
  *G01R 29/08* (2006.01)
  *G01N 29/14* (2006.01)
  *H04N 5/272* (2006.01)
  *H04N 7/18* (2006.01)

(52) U.S. Cl.
  CPC ... *G05D 1/0094* (2013.01); *G05D 2201/0207* (2013.01); *H04N 5/272* (2013.01); *H04N 7/18* (2013.01)

(58) Field of Classification Search
  CPC ........ G05D 1/0231; H04N 5/272; H04N 7/18; G01S 15/89; G01S 11/12; B29C 64/232; A63F 13/213; G06K 7/10594; G01V 8/12; B25J 9/1664; F02D 1/16; G06F 3/01
  See application file for complete search history.

(56) References Cited

U.S. PATENT DOCUMENTS

| | | | |
|---|---|---|---|
| 11,209,345 B1 | 12/2021 | Madsen et al. | |
| 2003/0042303 A1* | 3/2003 | Tsikos | G06K 7/10594 235/384 |
| 2003/0158709 A1 | 8/2003 | Ishida et al. | |
| 2003/0200060 A1 | 10/2003 | Eryurek | |
| 2006/0214907 A1* | 9/2006 | Devos | A63F 13/213 345/108 |
| 2009/0112334 A1 | 4/2009 | Grichnik et al. | |
| 2010/0060901 A1* | 3/2010 | Martin | G01V 8/12 356/512 |
| 2011/0231146 A1 | 9/2011 | Hsiao | |
| 2016/0014406 A1* | 1/2016 | Takahashi | G01S 11/12 348/148 |
| 2017/0361468 A1* | 12/2017 | Cheuvront | G06F 3/01 |
| 2018/0061050 A1 | 3/2018 | Zalev et al. | |
| 2018/0119692 A1 | 5/2018 | Bangor et al. | |
| 2019/0042980 A1 | 2/2019 | Imhof et al. | |
| 2019/0101911 A1 | 4/2019 | Katz | |
| 2019/0129026 A1 | 5/2019 | Sumi et al. | |
| 2019/0152495 A1* | 5/2019 | Altonji | F02D 1/16 |
| 2019/0210227 A1* | 7/2019 | Casner | G01S 15/89 |
| 2020/0130130 A1 | 4/2020 | Chen et al. | |
| 2020/0182684 A1 | 6/2020 | Yoskovitz et al. | |
| 2020/0361152 A1* | 11/2020 | Shusteff | B29C 64/232 |
| 2021/0056377 A1 | 2/2021 | Pedicini et al. | |
| 2021/0174019 A1 | 6/2021 | Jiang et al. | |
| 2021/0388837 A1 | 12/2021 | Nygaard et al. | |

FOREIGN PATENT DOCUMENTS

| | | | |
|---|---|---|---|
| WO | 2007058695 A1 | 5/2007 | |
| WO | WO-2017214581 A1 * | 12/2017 | .......... G05D 1/0088 |

OTHER PUBLICATIONS

Shan-Bin Sun et al., "A Data-Driven Response Virtual Sensor Technique with Partial Vibration Measurements Using Convolutional Neural Network," Sensors 2017, 22 Pages.

* cited by examiner

DYNAMIC SPATIOTEMPORAL BEAMFORMING

TECHNICAL FIELD

This disclosure relates generally to a system and method of sensing using sound.

BACKGROUND

Beamforming involves using an array of sensors and signal processing techniques such as phased array processing to boost transmitted or received signal in a specific direction in space. Such techniques can also be used to map energy distribution of signal sources in the field of view of the sensor. Aggregation of signals over time can improve the spatial resolution of the energy maps.

SUMMARY

A mobile robotic platform for data acquisition includes a transceiver within the mobile robotic platform, a locomotion unit configured to move the mobile robotic platform within an area, a sensor coupled with the locomotion unit and configured to output a signal including background noise, distortions, and foreground signals of interest, and a controller. The controller may be configured to request a measurement of a parameter from the sensor associated with a position and direction of the mobile robotic platform, store the measurement and the position and direction of the mobile robotic platform within the area, request the locomotion unit to move the mobile robotic platform within the area to a new position and direction, in response to the locomotion unit moving the mobile robotic platform to the new position and direction, request a second measurement of the parameter from the sensor associated with the new position and direction of the mobile robotic platform, spatially aggregate signals from the sensor and associated position and direction of the mobile robotic platform within the area to create an energy map via spatio-dynamic beamforming, wherein the energy map is indicative of signal intensity as a function of spatial dimensions, and wherein the background noise and distortions are reduced, by spatially averaging spatio-dynamic beamformed information acquired across multiple locations to synthesize signals indicative of the foreground signals of interest, and analyze the energy map to identify a state of an apparatus in the area.

A system for imaging a room may include a mobile platform configured to move within the room, a sensor coupled with the mobile platform and configured to measure a parameter within an area relative to the sensor and output a signal having background noise, distortions, and a foreground signal of interest associated with the parameter within the area, and a controller. The controller may be configured to, request a measurement of the parameter from the sensor associated with a position of the mobile platform and a direction of the mobile platform, store the measurement and the position and direction of the mobile platform within the room, move the mobile platform within the room to a new position, in response to the mobile platform reaching the new position, request a second measurement of the parameter from the sensor associated with the new position of the mobile platform and direction of the mobile platform, spatially aggregate the signal from the sensor and associated position and direction of the mobile platform within the room to create an energy map via spatio-dynamic beamforming, wherein the background noise and distortions are reduced, by spatially averaging beamformed information acquired across multiple locations to synthesize signals indicative of the foreground signal of interest, analyze the energy map to identify a status of an apparatus in the room, and output a foreground beamformed image.

A method for imaging a room by a controller includes requesting a signal, indicative of a measurement of a parameter, from a sensor associated with a position and direction of a mobile platform in the room, wherein the measurement from the sensor includes background noise, distortions, and a foreground signal of interest, storing the measurement, position and direction of the mobile platform within the room, requesting the mobile platform to move to a new position within the room, in response to the mobile platform reaching the new position, requesting a second measurement of the parameter from the sensor associated with the new position and direction of the mobile platform at the new position, spatially aggregating the signal from the sensor and associated position and direction of the mobile platform within the room to create an energy map via spatio-dynamic beamforming, wherein the background noise and distortions are reduced, by spatially averaging beamformed information acquired across multiple locations to synthesize signals indicative of the foreground signal of interest, analyzing the energy map to identify a state of an apparatus in the room, and outputting a foreground beamformed image.

DETAILED DESCRIPTION

Figure 1:
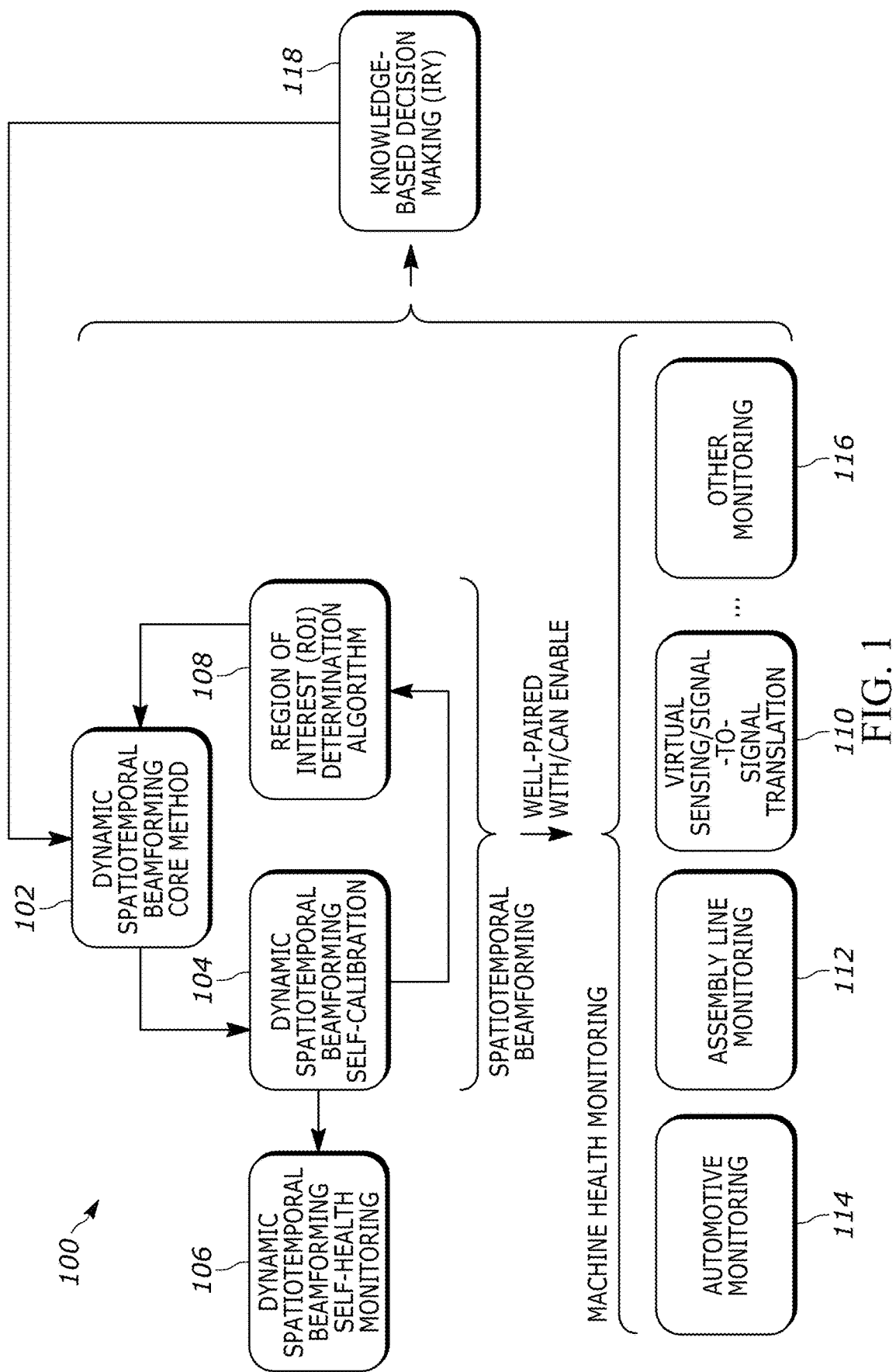
FIG. 1 is a flow diagram of a machine monitoring system using dynamic spatiotemporal beamforming.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The term "substantially" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

The term sensor refers to a device which detects or measures a physical property and records, indicates, or otherwise responds to it. The term sensor include an optical, light, imaging, or photon sensor (e.g., a charge-coupled device (CCD), a CMOS active-pixel sensor (APS), infrared sensor (IR), CMOS sensor), an acoustic, sound, or vibration sensor (e.g., microphone, geophone, hydrophone), an automotive sensor (e.g., wheel speed, parking, radar, oxygen, blind spot, torque), a chemical sensor (e.g., ion-sensitive field effect transistor (ISFET), oxygen, carbon dioxide, chemiresistor, holographic sensor), an electric current, electric potential, magnetic, or radio frequency sensor (e.g., Hall effect, magnetometer, magnetoresistance, Faraday cup, Galvanometer), an environment, weather, moisture, or humidity sensor (e.g., weather radar, actinometer), a flow, or fluid velocity sensor (e.g., mass air flow sensor, anemometer), an ionizing radiation, or subatomic particles sensor (e.g., ionization chamber, Geiger counter, neutron detector), a navigation sensor (e.g., a global positioning system (GPS) sensor, magneto hydrodynamic (MHD) sensor), a position, angle, displacement, distance, speed, or acceleration sensor (e.g., LIDAR, accelerometer, Ultra-wideband radar, piezoelectric sensor), a force, density, or level sensor (e.g., strain gauge, nuclear density gauge), a thermal, heat, or temperature sensor (e.g., Infrared thermometer, pyrometer, thermocouple, thermistor, microwave radiometer), or other device, module, machine, or subsystem whose purpose is to detect or measure a physical property and record, indicate, or otherwise respond to it.

The term image refers to a representation or artifact that depicts perception (e.g., a visual perception from a point of view), such as a photograph or other two-dimensional picture, that resembles a subject (e.g., a physical object, scene, or property) and thus provides a depiction of it. An image may be multi-dimensional in that in may include components of time, space, intensity, concentration, or other characteristic. For example, an image may include a time series image.

Systems and methods for producing high-resolution energy maps of a given space using a beamformer mounted on a mobile platform are disclosed. The energy maps may indicate signal intensity, such as power as a function of spatial dimensions. These methods can be used to acquire information from a variety of energy sources, e.g., acoustic, electromagnetic, but are primarily discussed in the acoustic domain. The system can include an array of receivers coupled with a variety of beamforming algorithms mounted on a mobile platform, which records spatiotemporal information as it moves in space. The methods disclosed here use the spatiotemporal information coupled with the beamformed information acquired at each location to produce a high-resolution map of the space. This map can be overlaid with visual information or can be used to monitor changes in acoustics or electromagnetic energy over time. Systems and methods for performing self-calibration tests to separate self-produced background noise during spatiodynamic beamforming operations are also disclosed. These methods can be used to identify self-noise associated with the recording platform, e.g., sensor hardware, motion-enabling hardware, e.g., robotic platforms, or other background noise. Using these methods, the output from spatiodynamic beamforming algorithms can be improved by separating background noise from foreground signals, which are signals associated with objects or areas of interest. The background self-noise can then be used to perform self-health diagnosis by monitoring changes in self-noise over time.

The ability to accurately monitor various sources of energy in a given environment continues to become increasingly important due to increased attention on human health and safety in complex industrial environments. In particular, monitoring acoustic energy is important from both human health and industrial perspectives. For humans, it is important to monitor acoustics to provide a safe working environment and prevent hearing loss. From an industrial perspective, acoustics can provide valuable insight into the health of machines or facilities in a way that visual monitoring cannot provide. However, acoustic monitoring of environments, spaces, and processes can be challenging for several reasons. First, the sound being emitted from one particular source tends to reflect off the surfaces of its surroundings, which can result in echoed versions of this signal arriving at a receiver, e.g., microphone, antenna, etc. Second, when there are a number of sources at play, the signals from these sources overlap, which makes it difficult for a receiver to determine from which source a particular noise was emitted.

To combat these issues, a multitude of beamforming algorithms have been developed. Beamforming allows for an array of receivers to improve signal quality by estimating the direction of arrival (DOA) of energy sources by comparing the signals recorded by each receiver. Broadly, beamforming algorithms are often split into three categories. The most basic category consists of maximizing the steered response power (SRP) of the received signals, and examples of these beamformers include delay-and-sum, filter-and-sum, and maximum likelihood estimation beamformers. The second category includes approaches using time-difference of arrival (TDOA) estimators, which look at the arrival time of a signal to each receiver. Essentially, if a signal arrived at receiver "A" before receiver "B," it can be estimated that the signal originated closer to receiver "A" barring echoes or other forms of interference. Given many receivers, TDOA estimators can both point in a particular direction from which it is believed that a signal originated and also filter out background noise to reconstruct the original signal of interest. The third category includes spectral-estimation-based locators, which includes the Multiple Signal Classification (MUSIC) algorithm used in many state-of-the-art devices. However, regardless of the chosen beamforming algorithm, the performance of the chosen beamformer is highly dependent upon the geometry of the receiver array.

Given an arbitrary array of receivers, the limitations of its beamforming capabilities are determined by the spacing between the receivers. As dictated by the Nyquist-Shannon Sampling Theorem, the minimum distance, $d_{min}$, between receivers to beamform a signal with wavelength $\lambda$ is given by $d_{min}=\lambda/2$. Given wave velocity c in the medium of propagation (e.g., speed of sound), the maximum frequency that can be beamformed by a receiver array with receiver spacing d is therefore given by $f_{max}=c/2d$. Above this frequency, aliasing will occur and it will become impossible to determine from which direction a signal emitted. Therefore, to beamform high-frequency signals, arrays with small spacing between receivers must be used. However, if low-frequency signals are also of importance, a tightly-spaced array designed for high-frequency applications will appear small and the phase difference between receivers will be minimal resulting in a large beam. In essence, this prevents beamforming from improving signal quality and precisely identifying DOA. In most beamforming applications, it cannot be assumed that signals will be narrowband. Due to the fact that signals are often broadband, uniformly spaced receivers result in a spectral shift in the beamformed signal. These facts have resulted in a significant amount of both academic and industrial research effort into optimal receiver array geometries and beamforming algorithms to equally capture information across a broadband frequency range. A primary limitation of these approaches and a primary reason for such effort is that receiver array hardware is typically spatially static, e.g., an antenna array fixed to the top of a tower. For sources that are far from an array, this can make two distinct sources appear that they are coming from the same location. For sources close to an array, the farfield assumption falls apart (incident waves cannot be modeled as plane waves) and source localization becomes a challenging task.

Synthetic Aperture Beamforming is a method that typically uses a 1D array of receivers to generate high-resolution 2D maps by stacking many high-resolution 1D measurements acquired at different locations. In practice this is typically performed by deploying a 1D array on, e.g., an aircraft or boat, which travels along a known path and reconstructs images of, e.g., islands or the ocean floor using sonar or radar. These methods are impractical for use cases such as monitoring a factory or other closed environments, frequently monitoring changes of an environment over time, or providing information localized in three dimensions.

Spatiodynamic beamforming (SB) also referred to as spatial-dynamic beam-forming, described herein, involves observing energy sources from multiple perspectives and using beamforming algorithms to stich this information together to obtain a complete picture of the energy map of a given space. SB methods can be used to acquire information about a variety of energies, e.g., electromagnetic, but will in this disclosure be discussed from an acoustics perspective. It should, however, be in no way concluded that these methods only apply to acoustic SB.

The field of foreground and background separation, often simply called "background subtraction", involves separating the foreground and background from one signal and is highly relevant for SB. The majority of the work in this field has stemmed from computer vision and video surveillance tasks. In the foreground objects of interest such as humans or vehicles moving about a frame are included. In the background, static or pseudo-static objects, such as trees, buildings, roads are included. By estimating the signals that make up the background, the foreground can be extracted from the overall signal such that following tasks can be completed with higher fidelity, e.g., following the motion of a human throughout a video. At a high-level, the fundamental assumption with background subtraction involves the idea that the background is relatively stationary such that, in a given temporal sequence of frames from one scene, the background objects are the same in every frames. By observing many frames and identifying the objects that do not change or change very little, the background can be identified and thus subtracted from the overall signal to reveal the foreground objects. Several methods have been devised to solve this problem such as kernel density estimation (KDE), Gaussian mixture models (GMMs), hidden Markov models (HMMs), various subspace approximation and learning techniques, and other various machine learning techniques in supervised, semi-supervised, and unsupervised learning, such as support vector machines (SVMs) and deep learning, e.g., convolutional neural networks (CNNs). Background subtraction techniques have also been adopted for acoustic background subtraction. However, the applications of this technology have been purely for stationary acoustics where the recording platform is does not change location spatially. Additionally, work in this area has primarily been done for identifying various background noises associated with the surrounding environment such as vehicular traffic, wind, HVAC systems, or other signals that may impact technologies such as speech recognition devices. Very little work has been done to isolate noise associated with the recording platform especially in the nascent field of acoustic devices mounted on mobile robotic platforms.

Due to the fact that spatiodynamic beamforming typically involves some sort of motion-capable platform, e.g., a drone, robotic platform, robotic arm, etc., some sort of self-noise is typically associated with the signals acquired via SB. Various embodiments of these sources of self-noise may include motors, servos, wheels, mechanical belts, fans, propellers, vents, jets, joints, gears, electronic devices, and other mechanical devices. Often, these processes produce structured noise or noise in which there is some known knowledge about the signal. This knowledge may include factors such as when the noise begins and ends but also may include more complex factors such as frequency content, statistics, or other mathematical quantities. In many cases, this structured noise is consistent across frames such that it can be considered to be a background. When performing spatiodynamic beamforming, these background noises are not desirable because they may alter the measurements that describe the overall energy of various portions of a given space. Given a method for separating this background from the rest of the signal, spatiodynamic beamforming methods could be improved by only including noise from regions or objects of interest in the calculations. Furthermore, by isolating the background signals associated purely with the motion platform, the background signal provides insight into the operations of the platform itself. By monitoring changes in this background signal over time and comparing that to the various activities of the platform, e.g., different types of motion, loads, runtimes, etc., an overall picture of the "health" of that platform can be understood.

Described herein are systems and methods for generating high-resolution spatiotemporal maps of energy for a region or space of interest via the novel combination of spatially-aware, mobile, beamforming receivers, called here spatiotemporal beamforming, also referred to as spatial-temporal beam-forming. A receiver or array of receivers in conjunction with beamforming algorithms are deployed on a mobile platform that records information at various locations and uses this spatially distributed information to reconstruct a coherent model of the measured space. It should be noted that these methods can be used to acquire information about a variety of energy sources including acoustic emitters and electromagnetic emitters. However, for simplicity, this disclosure may be primarily discussed from an acoustic perspective. Systems and methods for isolating the noises associated with a robotic or mobile platform and recording devices used in spatiodynamic beamforming to improve the output of spatiodynamic beamforming algorithms and also provide insight into the operations of the platform itself are also disclosed. It should be noted that these methods can be used to acquire information about a variety of energy sources including acoustic emitters and electromagnetic emitters. However, for simplicity, this disclosure may be primarily discussed from an acoustic perspective.

In one general aspect, a mobile receiver or array of receivers with spatial awareness is disclosed. The system includes some form of locomotion unit including but not limited to a wheeled robotic platform, track, jet, propeller, air, drone, or robotic arm that moves the array of receivers. The mobile portion of this system includes some form of measuring and recording system telemetry. The telemetric portion of this system may include an apparatus attached to the mobile platform that provides this information, e.g., optical imaging, Radar, LiDAR, etc., or it may also include a system not attached to the mobile platform such as a motion capture or simultaneous localization and mapping (SLAM) system. The array of receivers may consist of a single receiver or a set of many receivers organized in a variety of 1D, 2D, or 3D geometric configurations. The system may also include on-board computing hardware and software that operates independently or in conjunction with separate computing hardware and software. Furthermore, the overall system may consist of multiple individual mobile platforms each with its own set of recording devices and localization capabilities which all communicate with one another and/or with a master system.

In another general aspect, a method for obtaining acoustic images of a particular space by combining beamformed information of the space from multiple different perspectives into one coherent map is disclosed. This method involves applying a beamforming algorithm to the data acquired by a receiver or array of receivers at one particular location and facing in one particular direction to determine the acoustic output (AO) of regions of interest (ROI) or objects of interest (OOI) within the field of view (FOV) of the receiver(s). The AO may consist of sound pressure level (SPL), frequency spectra, time-series signals, or other recording methods. The AO of each ROI/OOI is logged and the acoustic array is then positioned in a new location. This new location may be realized via a shift in the receiver array itself, e.g., yaw, pitch, roll, or by completely relocating the array in three-dimensional space. At the new location the same AO recording for all ROI/OOI within the FOV are recorded including all previously recorded ROI/OOI within the FOV or new ROI/OOI that were not in any previous FOV. For ROI/OOI that have been previously measured, the new AO is stored in a database along with previous measurements acquired from other locations. This process of recording and repositioning is repeated ad infinitum until a complete map of the imaged space is acquired using the algorithms described herein.

In another general aspect systems and methods for performing self-calibration in which noises associated with the recording instrument or platform are isolated from the noises of interest.

In another general aspect noises associated with the recording instrument or platform are used to perform self-health monitoring.

Certain aspects will now be described in detail to provide an overall understanding of the class of devices, principles of use, design, manufacture, and associated methods, algorithms, and outputs disclosed herein. One or more examples of these aspects are illustrated in various non-exhaustive embodiments in the accompanying drawings. Those with ordinary skill in the art will understand that the methods and devices described in this disclosure and accompanying drawings are non-limiting examples and that the scope of this disclosure is defined solely by the claims.

In many industrial, commercial, or consumer applications, monitoring the energy of the surrounding environment is critical to human health, machine performance, infrastructure health and integrity, and maintaining many other assets. This energy may include but is not limited to acoustic (including audible, ultrasonic, and infrasonic sound) energy, visible light and the entire electromagnetic spectrum, nuclear energy, chemical energy, thermal energy, mechanical energy, and even gravitational energy. A multitude of sensors and methods have been devised to monitor these various forms of energy. Most often, these sensors are used in a static fashion, i.e., they are placed in one given location and monitor their surrounding environment from that point-of-view, e.g., a security camera, microphone, or thermal imager. However, from these locations, there are sources of noise that interfere with the recordings of various ROI/OOI within the FOV of the sensor. Various algorithms have been developed to account for this interference, e.g., beamforming, but this cannot solve two problems: (1) not all noise sources can be isolated and removed from the ground-truth signal of interest and (2) not all signals of interest can be acquired from any given location. Described herein are methods and systems designed to solve these problems via the novel combination of a mobile, location-aware platform with sensor technology. These methods and systems are primarily described from an acoustics perspective. However, operating in the acoustic domain should not be considered to be a limiting embodiment of this disclosure.

FIGS. 11-16 are a set of example embodiments of spatially-aware robotic platforms that may be used to spatially modulate sensor hardware used for data acquisition. In one embodiment, the robotic platform is a wheeled platform that has a sensor array system mounted directly to the chassis. The platform may also be used to hold other cargo. In another embodiment, the same wheeled robotic platform is employed but a specialized mounting system is used to position the sensor array in a particular location or set of locations statically or dynamically. This robotic platform may also induce locomotion via other means such as tracks, ball bearings, rollers, or other means. In another embodiment, the robotic platform is in the form of a drone that uses air propellers to induce locomotion. The sensor array system may be placed directly on the drone chassis or on a specialized arm that positions the sensors arbitrarily. In another embodiment, the robotic platform is in the form of a drone or airborne object that uses some other form of locomotion such as jet propulsion or anti-gravity. Again, the sensor array system may be placed arbitrarily. In another embodiment, the robotic platform is in the form of a robotic arm that offers multiple degrees of freedom for sensor positioning. This robotic arm may or may not be integrated with some other robotic platform to increase locomotive abilities. In yet another embodiment, the robotic platform may be in the form of a droid-like robot that can move in space in a similar manner to a human. The sensor array system could be mounted to the body of the droid robot or otherwise. In yet another embodiment not illustrated in FIGS. 11-16, the robotic platform may not be robotic in nature but rather a positioning device that is manually positioned and repositioned by a human.

In various aspects, the robotic platform may be configured to localize itself in space relative to other objects around itself or to an initialized location or set of locations to provide telemetry information. This telemetry information could include distances to ROI or OOI, precise coordinates in space given a set of reference coordinates, distances traveled, tilt, pitch, and roll angles, or other means of localization. The telemetric portion of this system may include an apparatus attached to the mobile platform that provides this information, e.g., optical imaging, Radar, LiDAR, RF, etc., or it may also include a system not attached to the mobile platform such as a motion capture or simultaneous localization and mapping (SLAM) system.

FIG. 1 is a flow diagram of a machine monitoring system using dynamic spatiotemporal beamforming 100. In block 102, a controller performs dynamic spatiotemporal beamforming also referred to as spatial-temporal beam-forming. Next, the controller will perform self-calibration in step 104. This self-calibration may be performed at regular or irregular intervals, such as a every time the system powers up, at a certain predetermined time interval, upon detection of a change in a physical measurement (e.g., temperature, pressure, detection of airborne particles such as oil droplets, or smoke) or detection of an anomaly in step 102. In step 106, the controller will perform self-health monitoring in step 104. Similar to step 104, the self-calibration may be performed at regular or irregular intervals, such as a every time the system powers up, at a certain predetermined time interval, upon detection of a change in a physical measurement (e.g., temperature, pressure, detection of airborne particles such as oil droplets, or smoke) or detection of an anomaly in step 102. In step 108 the controller will perform a region-of-interest (ROI) in step 104. This self-calibration may be performed at regular or irregular intervals, such as a every time the system powers up, at a certain predetermined time interval, upon detection of a change in a physical measurement (e.g., temperature, pressure, detection of airborne particles such as oil droplets, or smoke) or detection of an anomaly in step 102. As the system monitors an area, special attention can be used to focus on ROIs and steps 102, 104, 108, and 106 may be used to with or paired to perform machine health monitoring. This includes virtual sensing 110, assembly line monitoring 112, automotive monitoring 114, or another machine health monitoring 116. This information can be used in a database in which a controller (either separate or the controller of step 102) performs a knowledge-based decision analysis.

Figure 3:
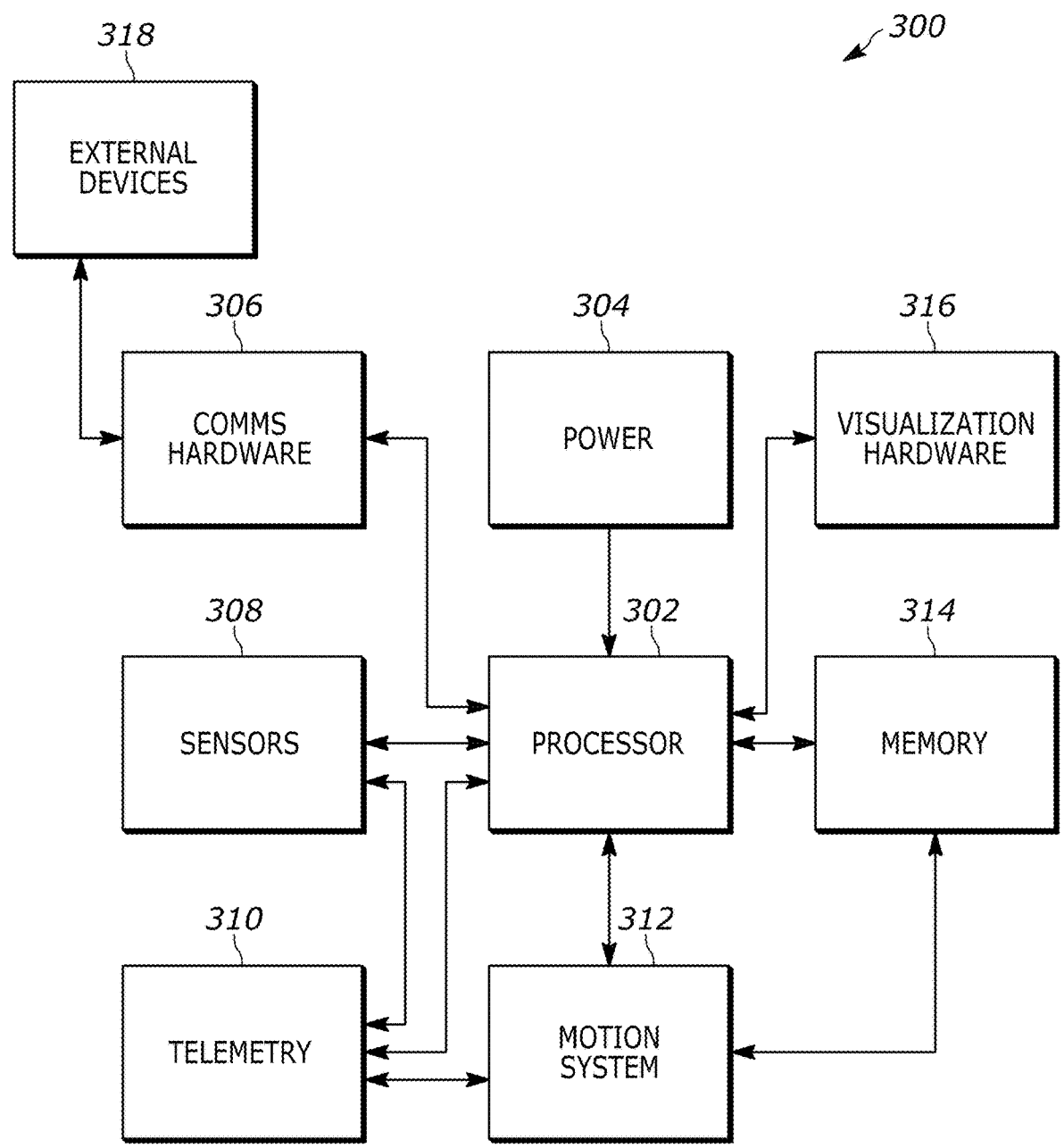
FIG. 3 is a block diagram of system for acquiring spatial-dynamic beam-formed energy maps.

FIG. 3 is a block diagram describing the hardware 300 in the system in accordance with at least one aspect of the present disclosure. Processor 302 is powered by power source 304, which may be in the form of a variety of power sources such as but not limited to batteries, wired power (e.g., to an AC outlet), or solar panels. Processor 302 may be a single central processing unit (CPU) processor consisting of one or more cores, a set of CPUs, a graphics processing unit (GPU), a set of GPUs, a combination of CPUs and GPUs, or a number of other computer hardware platforms and devices. Processor 302 interacts with communications hardware 306, which communicates with external devices and systems 318. Some examples of communications protocols include Bluetooth, Wi-Fi, RFID, and others. External devices 318 may be other robotic platforms, infrastructure, centralized control computers, and others. Processor 302 also interacts with sensors 308, which may include sensors used for recording environmental data for spatio-dynamic beamforming such as microphones or electromagnetic sensors, and sensors 308 may also include other types of sensors used for localization, telemetry, and motion such as cameras, ultrasonic detectors, LiDAR, Radar, and other sensor modalities. Sensors 308 and processor 302 interact with telemetry system 310 and motion system 312, which provide varieties of location-aware locomotion to the robotic platform. Processor 302 and motion system 312 store information in memory 314 which may, for example, be in the form of random-access memory (RAM), hard drive storage, solid state storage, or other types of storage. A variety of data may be stored in memory 314. Embodiments of the hardware described by at least one aspect of the present disclosure may also include visualization hardware 316 and accompanying software to allow the robotic platform to provide visual information to users or other robots indicating a variety of information such as robot status, status of other hardware, recording mode, location information, reconstructed spatio-dynamic maps, and other information. Example embodiments of visualization hardware 316 include but are not limited to LCD/LED screens, LEDs, digital displays, and analog devices.

Figure 2:
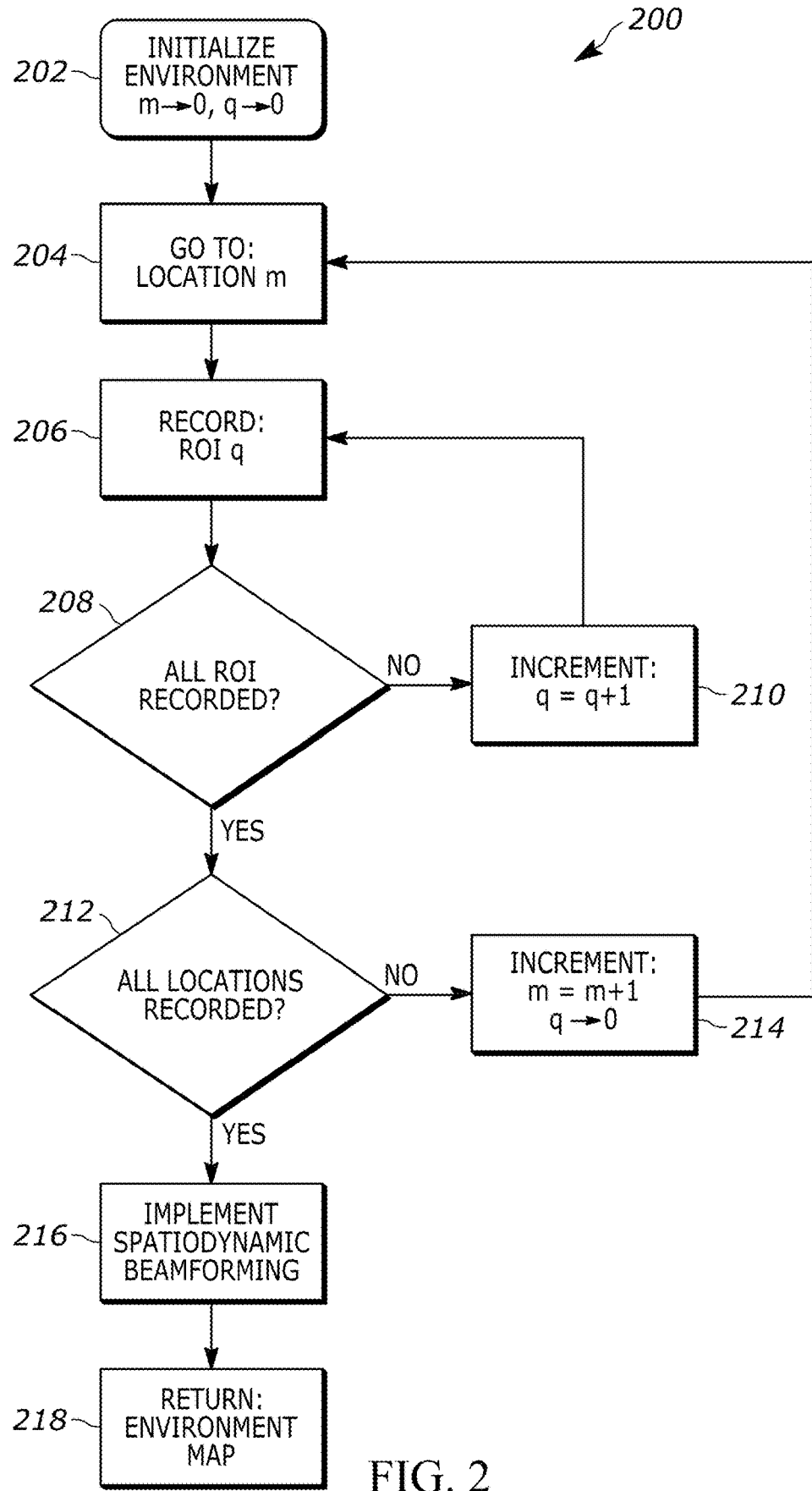
FIG. 2 is a flow diagram for acquiring spatial-dynamic beam-formed energy maps.

FIG. 2 is a block diagram of a high-level method 200 for acquiring spatio-dynamically beamformed energy maps in accordance with at least one aspect of the present disclosure. During initialization step 202, certain parameters may be chosen for a particular environment of interest. In particular, aspects such as ROIs, OOIs, spatial resolution, recording parameters (e.g., sampling frequency and duration), recording locations, etc. are chosen, which may vary depending on the environment of interest. One example embodiment of several of these aspects that may be chosen for a specific type of environment such as a production line that includes a variety of robots, machines, conveyor belts, and other mechanical devices may include ROI/OOI specific to each mechanical device, certain portions of each mechanical device, portions or all parts of assembly processes, areas where humans inhabit, products of such a production line, and other areas of interest. In this embodiment, the sampling frequency and duration chosen for sensor recording may be chosen to monitor specific signals, i.e., narrowband, or a wide range of signals (broadband) with varying spatial frequencies (e.g., continuous vs. transient). Other embodiments of these parameters can vary drastically depending on the environment of interest. Importantly, the recording locations may also be chosen during or before this initialization period. These locations may be chosen to represent a particular pattern or may be chosen at random. Furthermore, in one embodiment, these locations may be chosen ad infinitum throughout the duration of recording, which may be virtually infinite, and the system may choose these locations either at random or according to some principle or set of principles. After initialization, the robotic platform positions itself (or is positioned) in an initial location, m in step 204. At this location, data the various ROIs/OOIs chosen during the initialization stage, q, are recorded in step 206 from location m. In another embodiment, these various ROIs/OOIs are not chosen during initialization, but rather are chosen throughout the recording process as new ROIs/OOIs are discovered. In step 208, the controller checks if all recording in step 206 are complete. If all regions of interest ROIs are not covered, the controller branches to step 210 and continues until data from all ROIs/OOIs are recorded.

Upon completion, the robotic platform is repositioned at a new location in step 214. This pattern is continued in steps 204-214 until all ROI/OOI have been imaged from all locations. At this point, the mathematical spatio-dynamic beamforming methods are applied in step 216 and environment map is returned in step 218. In another embodiment briefly described above, the pattern of moving as in step 204 and recording as in step 206 throughout various locations is repeated continuously and the algorithm in FIG. 2 continues without much benefit. In this embodiment, the environmental map from step 218 is returned by spatio-dynamic beamforming in step 218 that may be returned at any time and may be continuously updated.

What follows is a mathematical formulation of a non-limiting embodiment of the spatio-dynamic beamforming algorithm used in conjunction with the other methods and systems in this disclosure to reconstruct the acoustic maps of the environment of interest. Given a microphone array with $n \in [0, \ldots, N]$ microphones, the frequency domain beamformed output of the array at spatial recording location $m \in M$ for spatial location of interest (i.e., ROI) $q \in Q$ is defined by $$Y_m(\omega, q) \equiv \sum_{n=0}^{N} G_{n,m}(\omega) X_{n,m}(\omega) e^{j\omega \Delta_n} \quad (1)$$

where $X_{n,m}(\omega)$ and $G_{n,m}(\omega)$ are the frequency domain signals of each microphone at each location and each microphone's associated filter, respectively. M and Q represent the sets of spatial locations in three-dimensional space of the recording locations and locations of interest, respectively. Here, first assume that the filters may change with location, but it is possible that $G_{n,m}(\omega) = G_{n,k}(\omega)$ $\forall m, k \in M$, e.g., filter-and-sum beamforming. Elementwise phasing is applied via $e^{j\omega \Delta_n}$ and is specific to any given q. The equation defining $Y_m(\omega, q)$ therefore represents any beamforming operation for any microphone array for spatial. Then define $$Y_m(\omega) \equiv Y_m(\omega, q) \forall q \in Q \quad (2)$$

to be the matrix representation of the acoustic map of all spatial locations recorded from locations in M. At any given spatial recording location, the signal acquired for each spatial ROI is not perfectly representative of the signal emitted from purely from each spatial ROI across and acoustic map even with the most optimal beamforming operation, i.e., there may be some noise and distortion associated with each signal. This noise, $K_m(\omega)$, and distortion, $A_m(\omega)$, can be due to a combination of signals from other sources, reflections, distortions, sensor noise, etc. Therefore, the acoustic map is also given by $$Y_m(\omega) = A_m(\omega) \cdot \hat{Y}(\omega) + K_m(\omega), \quad (3)$$

where $\hat{Y}(\omega)$ represents the ground-truth acoustic map for all ROI irrespective of recording location. Our goal is to find $\hat{Y}(\omega)$ because it contains the true signals emitted by each source/ROI unaltered by other sources, reflections, absorption due to attenuation and scattering, etc. Importantly, assume $$K_m(\omega) \neq K_j(\omega) \forall m, j \in M, m \neq j \quad (4)$$

$$A_m(\omega) \neq A_j(\omega) \forall m, j \in M, m \neq j. \quad (5)$$

Also assume that distortions caused by $A_m(\omega)$ are primarily due to sensor issues, e.g., lens scratches, damaged microphones, etc. and do not irreparably distort the overall signal. Under this assumption, $A_m(\omega) \approx I$, wherein I is the identity matrix.

Therefore, $$\because \lim_{|M| \to \infty} \frac{1}{|M|} \sum_{m \in M} K_m(\omega) = 0 \quad (6)$$

$$\hat{Y}(\omega) = \lim_{|M| \to \infty} \frac{1}{|M|} \sum_{m \in M} \left( A_m(\omega) \cdot \hat{Y}(\omega) + K_m(\omega) \right) \quad (7)$$

$$\hat{Y}(\omega) = \lim_{|M| \to \infty} \frac{1}{|M|} \sum_{m \in M} Y_m(\omega). \quad (8)$$

Because the acoustic map noise $K_m(\omega)$ varies by location, if the acoustic map $Y_m(\omega)$ is recorded from enough locations, the average acoustic map from these locations will approach $\hat{Y}(\omega)$.

Figure 4:
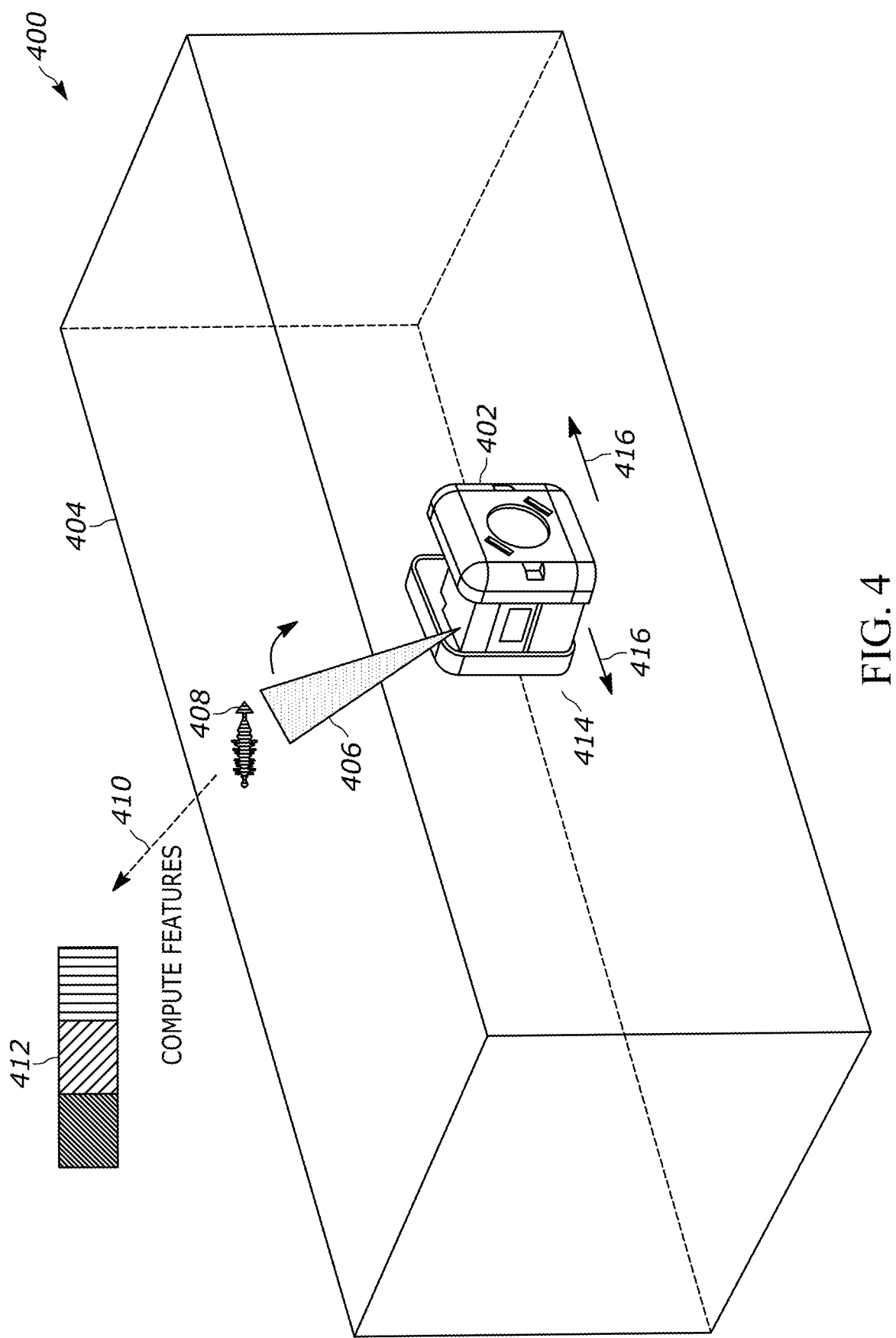
FIG. 4 is a graphical illustration of motion of a robotic platform configured to acquire spatial-dynamic beam-formed energy maps throughout an area.

FIG. 4 is an illustration of an example embodiment of motion of a robotic platform throughout an area, room, or environment in accordance with at least one aspect of the present disclosure. The robotic system 400 in FIG. 4 most closely resembles an airborne drone-style robotic platform, but it should be understood that any embodiment of the robotic platform including those in FIGS. 11-16 or other embodiments may be used including those that exhibit motion 416 in any and all arbitrary direction(s) or some subset of all possible directions, e.g., can move with three-degrees-of-freedom on the floor of such environment or enclosure. Robot 402 moves about room or environment 404 and collects data 408. Area, room, or environment 404 may be an enclosed room of arbitrary shape and size or it may be an open or partially-open environment also of arbitrary shape and size. Data 408 may be acquired via some beamforming algorithm 406 that acquires data across a swath 414 which may encompass a particular segment or slice of room 404 as indicated in FIG. 4 or it may record segments of a cone or sphere, for example. Data 408 may be processed via spatio-dynamic beamforming to form an energy map of room 404. Furthermore, various algorithms such as classical signal processing techniques or modern data-driven approaches in the fields of machine and/or deep learning or otherwise may be applied to data 408 to compute various features 410 and output some data 412 that indicates certain states of environment 404. These data 412 may indicate things such as machine health, room health, human traffic, and other features. Room 404 may therefore contain many different items or processes of interest, which may be analyzed by features 410 and output data 412.

Figure 5A:
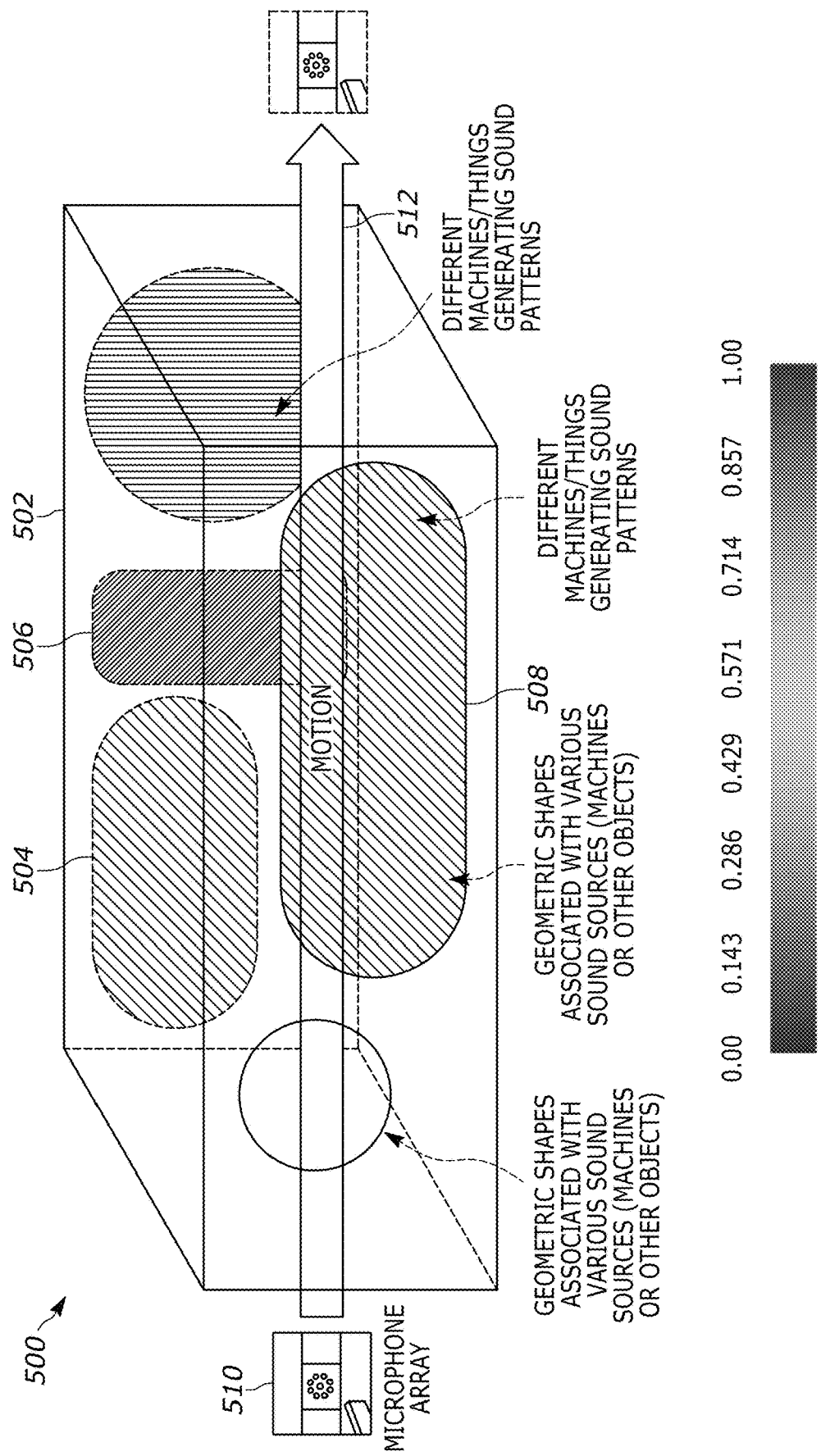
FIG. 5A is graphical illustration of an acoustic map of an area acquired via spatial-dynamic beamforming of data acquired from a sensor system on a mobile robotic platform.

FIG. 5A is an acoustic mapping system 500 of an environment acquired via spatio-dynamic beamforming of data acquired from a sensor system on a mobile robotic platform in accordance with at least one aspect of the present disclosure. In the present embodiment, a 3D version of an area 502 such as a room, but room 502 may be represented in an arbitrary number of other dimensions, e.g., 1, 2, 3, 4, or more dimensions. The data 504 and 506 represent the energy levels defined by scale. In the present embodiment, scale is scaled from 0 to 1 and represents intensity. However, this scale could also indicate other features such as frequency content or types of objects. Data 506 and 508 are co-registered with 502 such that their data represent what has happened spatiotemporally in that particular location. In this example, data 506 indicates that one area is of low energy and data 504 indicates that one area is of high energy. In this embodiment, room 502 is an empty room. However, room 502 in this map may also include other objects of interest.

Figure 5B:
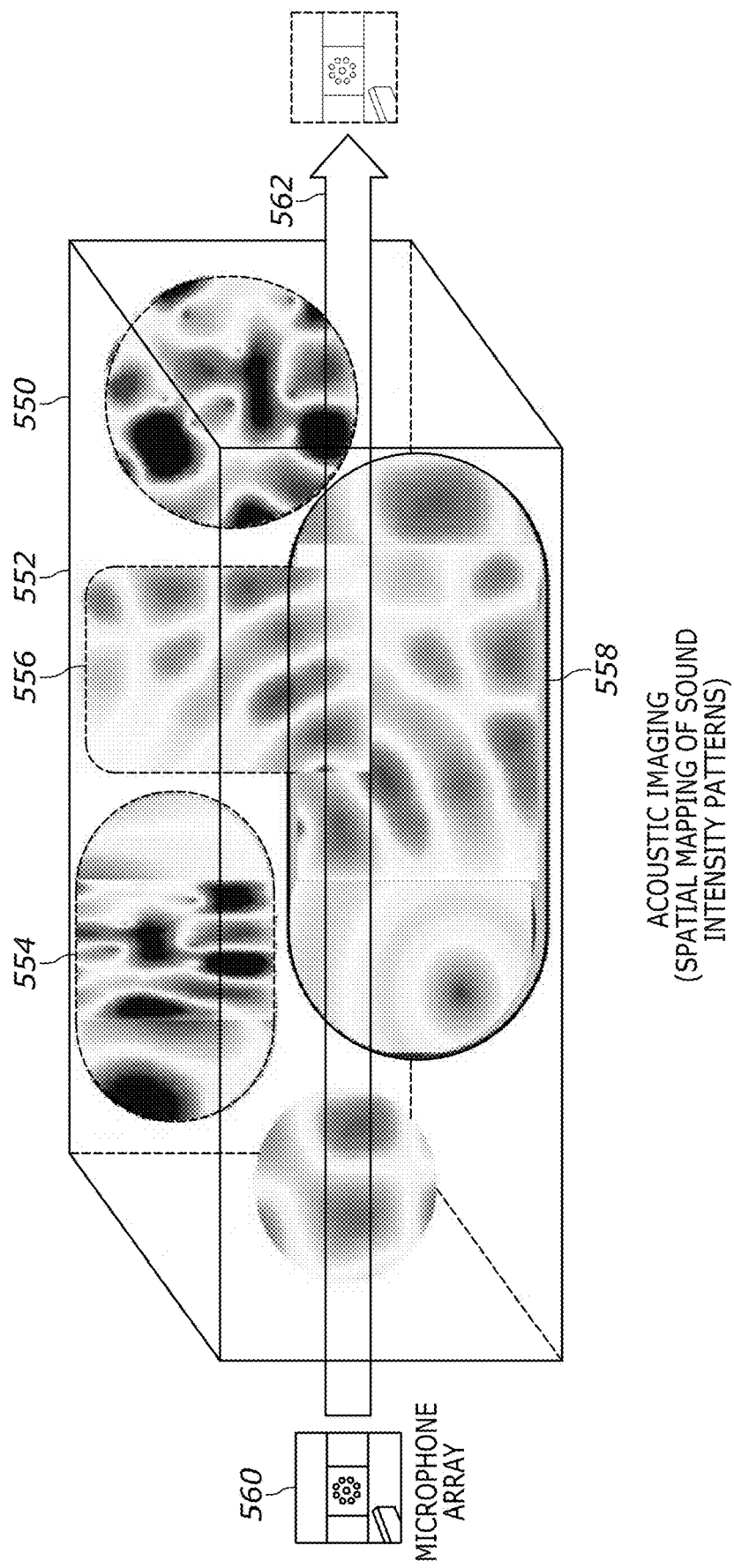
FIG. 5B is graphical illustration of an acoustic map of an area acquired via spatial-dynamic beamforming of data acquired from a sensor system on a mobile robotic platform.

FIG. 5B is an acoustic mapping system 550 of an environment acquired via spatio-dynamic beamforming of data acquired from a sensor system on a mobile robotic platform in accordance with at least one aspect of the present disclosure. In the present embodiment, a 3D version of room 552 is displayed, but room 552 may be represented in an arbitrary number of other dimensions, e.g., 1, 2, 3, 4, or more dimensions. The data 554 and 556 represent the energy levels defined by scale. In the present embodiment, scale is scaled from 0 to 1 and represents intensity. However, this scale could also indicate other features such as frequency content or types of objects. Data 556 and 558 are co-registered with 552 such that their data represent what has happened spatiotemporally in that particular location. In this example, data 556 indicates that one area is of low energy and data 554 indicates that one area is of high energy. In this embodiment, room 552 is an empty room. However, room 552 in this map may also include other objects of interest.

However, an important aspect of the processes typically associated with SB is a mobile platform of some variety that moves recording equipment about the area of interest. The motion associated with these platforms typically involves some noise that can be recorded by the SB acquisition equipment thus altering the recorded measurements. In this disclosure, methods for removing this noise from the SB measurements are disclosed. When this noise has been correctly isolated and removed, it purely represents noise associated with the mobile platform. Methods for then monitoring the state and health of the mobile platform given this noise isolation are also disclosed herein.

Figure 6:
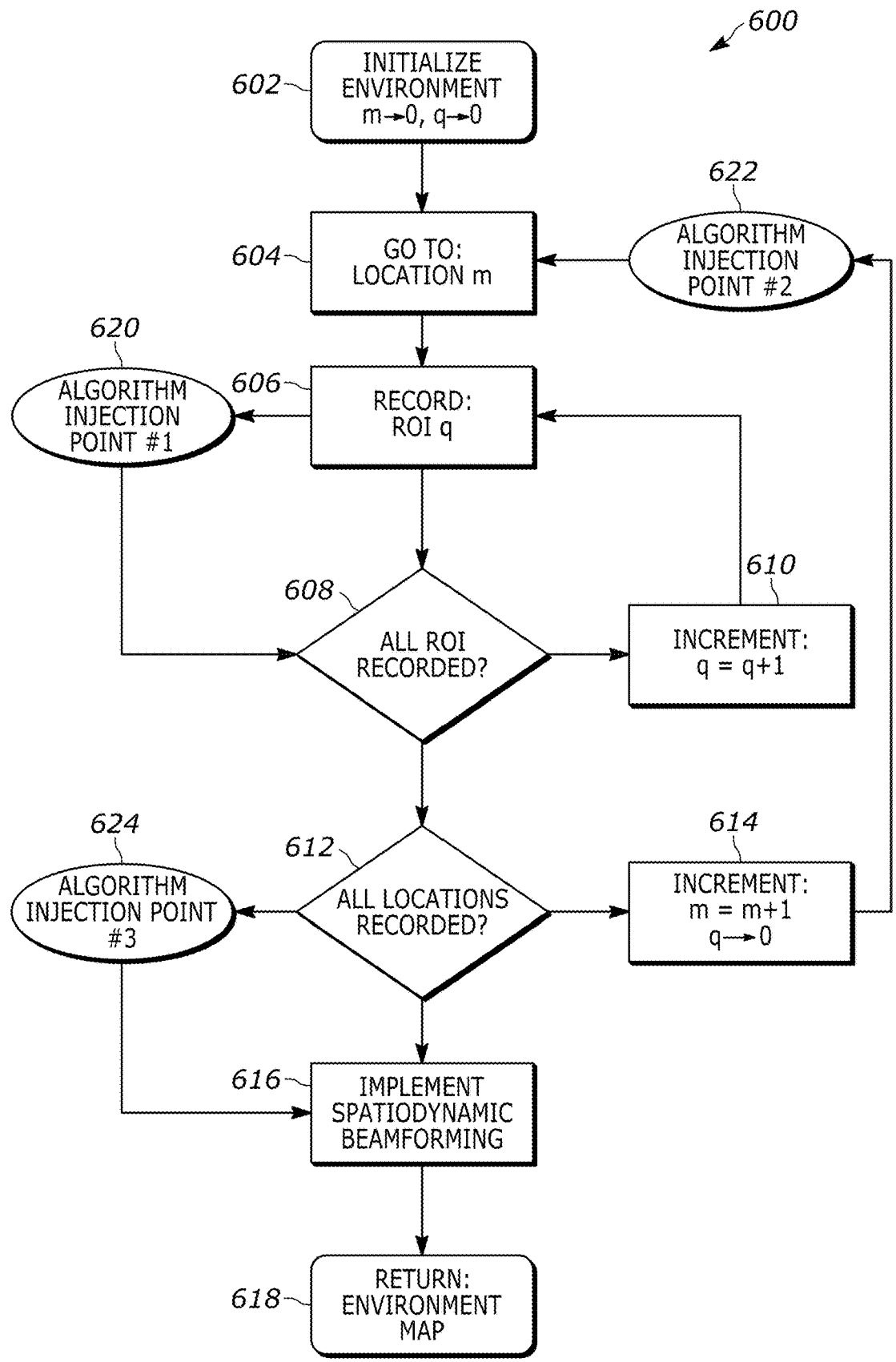
FIG. 6 is a flow diagram of a self-calibration and self-diagnosis system using spatiodynamic beamforming to create an environment map.

FIG. 6 shows a high-level block diagram of various embodiments of implementing self-calibration and self-diagnosis algorithms into a spatiodynamic beamforming algorithm 600 implementation in accordance with at least one aspect of the present disclosure. Without self-calibration and self-diagnosis algorithms, the SB system would initialize its environment in step 602, move to location m (which may be its starting location) in step 604, record data at step 606, check of all regions of interest ROI are recorded in step 608, and increment a counter in step 610. Then check if all locations are recorded in step 612 and move to the next location 614 until all locations have been recorded. Upon completion of recording, SB is typically applied at step 616 to return environmental map in step 618. In one potential embodiment of the methods in this disclosure, self-calibration and self-diagnosis algorithms (the "calibration") can be applied at algorithm injection point 1 that is step 620 such that data is analyzed after every region of interest (ROI) or object of interest (OOI), q, is acquired. In another potential embodiment, the calibration can be applied at algorithm injection point 2 at step 622 after all ROI have been acquired for a given recording location. In yet another possible embodiment, the calibration can be applied at algorithm injection point 3 in step 624 after all ROI at all locations have been acquired. These three algorithm injection points offer various benefits. At algorithm injection point 1, the calibration is only applied on a small amount of data. While this may result in some information loss or overfitting, this is likely the fastest algorithm injection point. In one potential embodiment of SB, various beamforming techniques, e.g., delay-and-sum beamforming, can be applied at step 606 to collect an aggregate signal from one ROI/OOI. In that embodiment, it should be noted that the calibration can be performed before or after the beamforming techniques used to acquire data q at any given ROI. At algorithm injection point 2, the calibration is applied to all ROI from one particular recording location. This potential injection point offers the advantage that it has more information about the noise associated with that particular location than injection point 1, but it is also likely to be more computationally complex than injection point 2. Injection point 3's advantage is that the calibration can be applied to all data throughout the entire recording domain, i.e., all ROI/OOI from all recording locations. This injection point is likely to be the most computationally complex due to the data volume overhead, but it may also provide the most accurate calibration. In yet another possible embodiment, SB may be applied over the course of hours, days, weeks, years, etc. In this embodiment, the calibration may be applied periodically over time to understand various state changes of the system implementing SB and the surrounding environment.

What follows is a mathematical formulation of several non-limiting embodiments of the self-calibration algorithms used in conjunction with spatiodynamic beamforming to acquire accurate acoustic maps of various environments and to perform self-health diagnosis of hardware used to acquire such information. Given recording $\vec{p} \in \mathbb{R}^{k \times 1}$ such that k represents the number of samples in the recording, define a function $f_m$ such that $$f_m : \vec{p} \to P, P \in \mathbb{R}^{m \times n} \qquad (9)$$

is a mapping from the vector form $\vec{p}$ to the matrix P where k=mn. The choice of m is dependent upon the sampling frequency of the recording and the feature size of the foreground and background noises of interest. The value m may be chosen to be any value but is chosen such that m≡n in its preferred embodiment. The singular value decomposition (SVD) is then applied to P such that $$P = U \sum V^T \qquad (10)$$

where $\sum = \begin{bmatrix} S & 0 \\ 0 & 0 \end{bmatrix}$, $S = \text{diag}(\sigma_1, \ldots, \sigma_n) \in \mathbb{R}^{r \times r}$, $\sigma_1 \geq \ldots \geq \sigma_r > 0$, $U \in \mathbb{R}^{m \times m}$, and $V \in \mathbb{R}^{n \times n}$.

The fundamental assumption with this algorithm is that the self-noise associated with the recording platform, or the "background" noise, is relatively consistent at any given time. Then apply mapping $f_m$, place a sample of this background noise in each column of P such that the majority of the information stored in P is low rank or even rank-1. A low rank version of the signal includes background noise, while a high rank version of the signal includes foreground data, foreground signal, or signal of interest information. When used for self-diagnosis, the high rank version of the signal includes foreground noise, while the low rank version of the signal includes background data. Then reconstruct the background noise from the original signal and then isolate the foreground portions of the signal via a rank-r approximation of P via $$P_{BG} = U_r \sum_r V_r^T \quad (11)$$

$$P_{FG} = P - P_{BG} \quad (12)$$

where $P_{BG}$ and $P_{FG}$ represent the background and foreground portions of the signal, respectively. The value of r is typically chosen to be small and is, in its preferred embodiment, typically between 1 and 5. However, the optimal value of r can be calculated via $$r_{opt} = \underset{r}{\mathrm{argmin}} \|\hat{P} - P_{FG}\|_F \quad (13)$$

where $\hat{P}$ is the ground-truth foreground signal and $\|\cdot\|_F$ is the Frobenius norm.

$$r_{opt} = \underset{r}{\mathrm{argmin}} \|P - P_{FG}\|_F$$

is of course impossible to calculate a priori without knowledge of the foreground signal, but it can be used, e.g., for calibration and experimental tests for various environments.

In the case where the background noise is unstructured, it may be desirable to convert the data into a spectral domain prior to performing the SVD separation.

$$P_{FG} = IFFT[S - S_{BG}] \quad (14)$$

An alternate embodiment of the spectral-domain based separation is to convert the data into a spectrogram and use a series of spectrogram "images" as the various frames. These frames are then vectorized via a similar mapping function to $f_M$ and then the SVD separation is applied Yet another embodiment that works particularly well when the background noise is highly structured is to use the cross correlation function to align the vectors in P, then truncate the ends of P such that there is no zero-padding, then perform the SVD background separation. Finally, using this known background, use the cross correlation again to align the estimated background to extract the foreground.

Yet another embodiment involves estimating what is called the "shift matrix," which essentially defines the phase variation between vectorized signals in the columns of P. Essentially, estimate this shift matrix, apply a de-shifting operation, and then apply our SVD separation algorithm. This may end up being mathematically identical to the cross correlation algorithm depending on how the shift matrix is calculated.

Then next part we will want to describe is how we inject the state knowledge of the system into this calculation. We want to make sure that we are only comparing states that are similar, e.g., the robot will probably sound different when it is moving in different ways or performing different tasks. We may also want to consider the case where we are only concerned with isolating the noise when the robot is just sitting somewhere rather than moving, which will probably be the easiest anyway.

Finally, given a good estimation of $P_{BG}$, we can use this as a metric for understanding the state of the mobile system used with SB. We define $n \in [0, N]$, which represents the total number of measurements acquired, i.e., the number of times in which the self-noise of the mobile robotic platform is calculated. The value of N may vary for a number of reasons such as how frequently acoustic maps of a given space are calculated, how the robotic platform is performing, or how its self-noise compares to that of other robotic platforms operating in the same general area. At a very high level, we can essentially use a distance measure between what we have measured previously and what we are measuring now and some pre-defined or potentially dynamic threshold to determine whether or not there is an issue. The distance measure we use could be something similar to the Frobenius norm or KL divergence, but is highly dependent upon how we are representing this information mathematically. The pre-defined or dynamic distance threshold would likely have to be dependent upon the robotic system and also its surroundings. We may also want to discuss adding in various information such as environmental conditions or load on the platform.

Here are details regarding the region-of-interest (ROI) determination as illustrated in block 108 of FIG. 1. Below ROI algorithms will be presented that include an example of what this Region of Interest (ROI) map may look like. It basically looks like a set of differently-sized square regions that exhibit different levels of signal output. There are a lot of ways this could be displayed: overall SPL in, e.g., dBA levels, it could represent some meta-info for a data structure that includes all the recordings for that patch, or some other info.

The set of algorithms (e.g., Algorithm 1-4 shown below) define a method for dynamically assigning levels of resolution throughout a given space for spatiotemporal beamforming. The purpose of these algorithms is to use higher resolution imaging for interesting areas and lower resolution imaging for quiet areas. The high-level algorithm that implements dynamically-generated spatial resolution mapping across multiple recording locations via spatiotemporal beamforming is shown in Algorithm 1. In this algorithm, the input is a list of recording locations, Locations, and the output is the resultant information obtained from those locations, data.

| Algorithm 1 High-Level Mapping Algorithm | |
|---|---|
| 1: procedure Create Map (Locations) | |
| 2:     S ← 1 | S set to some arbitrary unit value |
| 3:     L ← 0 | |
| 4:     data ← [ ] | data initialized as structure that holds signals and locations |
| 5:     while 3 Locations do | Map at all locations |
| 6:        data[L] =INVESTIGATE (S, Locations.pop[0]) | Treat Locations as LIFO stack |
| 7:        L ← L +1 | |
| 8:        ANALYZE AND MOVE (Locations[0]) | |
| 9:     return data | |

In Algorithm 1, the initial spatial resolution used to define the size of an individual region of interest (ROI), S, is set to some arbitrary unit value. In this embodiment, S←1. However, S should be set to an appropriate value for a given space given size restrictions, the acoustic profile of objects of interest, and the physical capabilities of the recording device. The location index, L, is set to 0 and is used to index the data structure, data, which is initialized as an empty, arbitrary data structure which may vary depending on both hardware and software requirements.

The MOVE algorithm referenced above represents the command and subsequent actions taken by an arbitrary robotic platform to move to a next location. The MOVE algorithm is not elaborated here in long form. For a given recording location, L, the fundamental investigation algorithm is shown in Algorithm 2, in which a recursive approach is used to investigate smaller and smaller areas until a sufficient level of resolution is achieved. This is related to the well-known Binary Search Algorithm.

Algorithm 2 Region of Interest Investigation Algorithm

```
1: procedure investigate
   (S, L, data, ROI = None)
2:    if ROI is None then
3:        ROI ← ROI(S)           S defines the initial
4:    for region in ROI do         spatial resolution
5:        signal = MEASURE(region)
6:        if INTERESTING(signal) then
7:            ROI_sub ← ROI(region, S/2)
8:            data ← INVESTIGATE
   (S/2, L, ROI_sub, data)
9:        else
10:           data[L]append(signal)
11:   return data
```

A sufficient level of resolution is determined by Algorithm 3 and can be based on many factors. For example, these factors could be based on both the acoustic content of a given area and the physical limits of the embodiment of these algorithms to resolve a smaller area. These factors are all included in the "if interesting then" statement. Algorithm 4 is used to define the spatial information of each ROI. The inputs to this algorithm are the current region, r, and the current segmentation factor, s. The most simple embodiment of 4 is just to segment the region r in half by the factor s. However, other more complex methods might segment it in a more informative way. Furthermore, this entire method should in no way be confined to a Cartesian system. The various regions could be of varying shape and size and also do not necessarily need to be convex.

Algorithm 3 Level of Interest Determination Algorithm

```
1: procedure interesting(signal)
2:    if interesting then
3:        return True
4:    else
5:        return False
```

Algorithm 4 Region of Interest Segmentation Algorithm

```
1: procedure roi(r,s)
2:    r_new = r/s
3:    return r_new
```

Next consider machine health monitoring as illustrated in block 110 of FIG. 1. Here virtual sensing/signal-to-signal translation systems will be disclosed. Systems and methods for acquiring estimates of data from one or more modalities, (e.g., source modalities) by analyzing data from a different modality or set of modalities, (e.g., target modalities) are disclosed. These methods can be used to "virtually" sense or acquire data from a variety of systems or processes via fundamental, linear or nonlinear mappings between the virtually sensed target data and the acquired source data learned by observing paired data between all modalities. This mapping is typically tied to some fundamental physical process, but it may also be derived from a more abstract process. Virtual sensing can enable sensors that are expensive and/or difficult to deploy to be replaced by a cheaper sensor and/or a sensor that is easier to deploy. Further, virtual sensing can enable predictive machine or process health monitoring and diagnostics by acquiring estimates of informative data.

Sensors allow people to observe and record the world around them and estimate predictions of future states of the world. For example, by using sensors to observe both local and global environmental metrics such as temperature, pressure, humidity, and the tracking of weather fronts, future states of weather can be predicted to high accuracy on a relatively short time horizon. Other sensors enable the observation of more microscopic processes such as the state of an engine, the stability of infrastructure, or the health of a human. Often times, these processes and the sensors used to observe them are related via some fundamental physical process. These could be some combination of mechanical, electrical, or chemical processes such as variations in current draw from a computer processor or hormonal signals inside of a living organism. Other times, these processes and their associated signals and sensors are more abstract, such as using stock prices as sensors to estimate and predict the health of a market. Regardless of the system, however, the sensors used to elucidate the state of a system are all related to the fundamental processes associated with that system and could therefore be related via some often nonlinear mapping or transfer function.

A common linear example of such a transfer function is the Ideal Gas Law, $PV=nRT$, where P, V, and T represent the pressure, volume, and temperature of a gas, respectively, n is a value that represents the amount of the gas in question and R is the unchanging ideal gas constant. If one knows the amount of gas in question, one can therefore use a temperature sensor to measure the pressure of the gas without having to use a pressure sensor. Due to the fact that a temperature sensor can also output the data of a pressure sensor given the proper mapping equation, it can be said that a temperature sensor can "virtually" sense pressure. However, many other processes of interest exhibit sensor transfer functions that are less linear such as degradation in various mechanical devices such as an automobile engine. In a typical engine, there are many moving components such as pistons, belts, fuel pumps, and many others. If, for example, the goal was to analyze fuel pump degradation, several possible sensors that could be used include temperature inside the pump, torque or speed of rotating components, structure-borne vibrations, airborne sounds released by such vibrations, flow rate induced by the pump itself, and many others. All of these sensors fundamentally relate to the state of the fuel pump in some way. If, for example, the rotating components that induce pump pressure begin to degrade and release particles, the friction inside the pump may increase thereby increasing the torque and temperature thus changing the noise profile in both airborne and structure-borne sounds and likely reduce the flow rate caused by decreased pressure inside the pump or pump failure. Pump failure is defined as a pump malfunction, and an imminent pump failure is defined as predicting a pump failure within 24 hours, although the pump may actually fail sooner. While all of these can sensors observe a fuel pump via different means and report different modes of information, they are all linked to the same fundamental physical processes associated with the pump itself. Therefore there should exist some likely nonlinear transfer function that maps the values of each sensor to one another in the same way that the Ideal Gas Law maps pressure to temperature.

Often times, it may be difficult or expensive to sense physical processes under real-world scenarios (e.g. measuring combustion pressure inside an engine or measuring the torque or flow-rate inside of a fuel pump when the vehicle itself is operating on the road). However, being able to do so may be imperative for the success of predictive diagnostics methods, machine health monitoring, and control of processes among others. At the same time, it may be less difficult or less expensive to instrument such systems and processes under laboratory settings to acquire those sensory data which may not be practical or very expensive to acquire in real-world, scaled deployments. Given these challenges, the use of laboratory (training) data from expensive sensors that are difficult to deploy in the field, in conjunction with cheaper sensors, which can be deployed in the field at scale, in a controlled settings to "virtually" sense hard-to-sense phenomenon and/or physical processes under field deployment. Thus, enabling signal-to-signal translation from the signals acquired via cheaper sensing solutions to the signals of other sensors that would otherwise be prohibitive to deploy in the field at scale for a multitude of reasons.

More specifically, described herein are systems and methods for estimating mappings, i.e., transfer functions, between sensors to enable virtual sensing between sensor modalities, i.e., virtual sensing. A variety of data-driven algorithms are trained using observations of all sensors-of-interest to predict the output from one or more sensors. These algorithms are then deployed in variety of embodiments to augment the capabilities of existing sensors by allowing them to virtually acquire data in the fashion of alternative sensors.

In one general aspect, various embodiments of a system for acquiring data and implementing virtual sensing in a variety of physical embodiments are disclosed. The system includes some form of data processing hardware and software that implements both the training and deployment portions of virtual sensing. A high-level system evaluates the output of the data processing system to inform states of the observed system to an operator or the observed system itself. A training-observable process is also included, which enables real-world measurements of sensors virtually-implemented at deployment time.

In another general aspect, overall methods for virtual sensing in which measurements of a process from one or more modalities are estimated from measurements one or more other modalities observing the same process via a learned mapping function are disclosed. The method includes methods for preprocessing data using both classical methods and modern approaches to prepare the data for virtual sensing. The method also includes a method for acquiring such physical-to-virtual sensor mapping function by training algorithms using sensors that can only be used in a training setup, e.g., in a laboratory but not at scale or in a real-world setting. The method also includes specifications for estimating real-world sensors from the virtual domain and methods for both jointly and dis-jointly learning these maps.

In another general aspect, specific methods for calculating physical-to-virtual sensor mapping functions via data-driven models are disclosed. These methods include various non-limiting potential and preferred embodiments including generative methods in which various types of algorithms generate virtual sensor data directly from physical sensor data.

In another general aspect, methods for monitoring a process and implementing predictive maintenance or diagnostics of various systems via virtual sensing are disclosed. The methods involve observing the output of virtual sensing systems and using virtually sensed data with or without physically sensed data to indicate various states of the process of interest. These states may include operating state, operating condition, failure modes, detection of specific events and others. Methods for implementing this monitoring include classical signal processing and statistics, machine learning, deep learning, and methods involving human-machine interaction.

In many industrial, commercial, consumer, and healthcare applications it is important to monitor the state of various processes. To do so, a variety of sensing modalities are frequently used. These sensors may include cameras, lasers, LIDAR, Radar, SLAM systems, microphones, hydrophones, ultrasonic sensors, sonar, vibrational sensors, accelerometers, torque sensors, pressure sensors, temperature sensors, fluid volume and flow rate sensors, altimeters, velocity sensors, g-force sensors, gas sensors, humidity sensors, heart rate monitors, blood pressure sensors, pulse-oximeters, EEG systems, EKG systems, medical imaging devices, and others. Sometimes, these sensors are cheap and easily deployable at scale such as low-cost microphones. Other sensors are more expensive and less easily deployable such as high-precision lasers. In some cases, the expense of the sensors or methods required for sensor implementation prohibit the sensor from being deployed in a practical setting whatsoever. For example, while relatively inexpensive torque sensors exist and can be used to evaluate various machines in a controlled, laboratory setting, they may be too bulky or too difficult to deploy inside every vehicle engine on the road. However, there are times in which the non-deployable sensors are the most important when it comes to understanding the state or health of a machine or process. Described herein are methods and systems designed to solve this problem by learning functions that map data from one sensor or set of sensors, (e.g., "source" or "physical" sensors), to data from another sensor or set of sensors, (e.g., "target" or "virtual" sensors).

Figure 7:
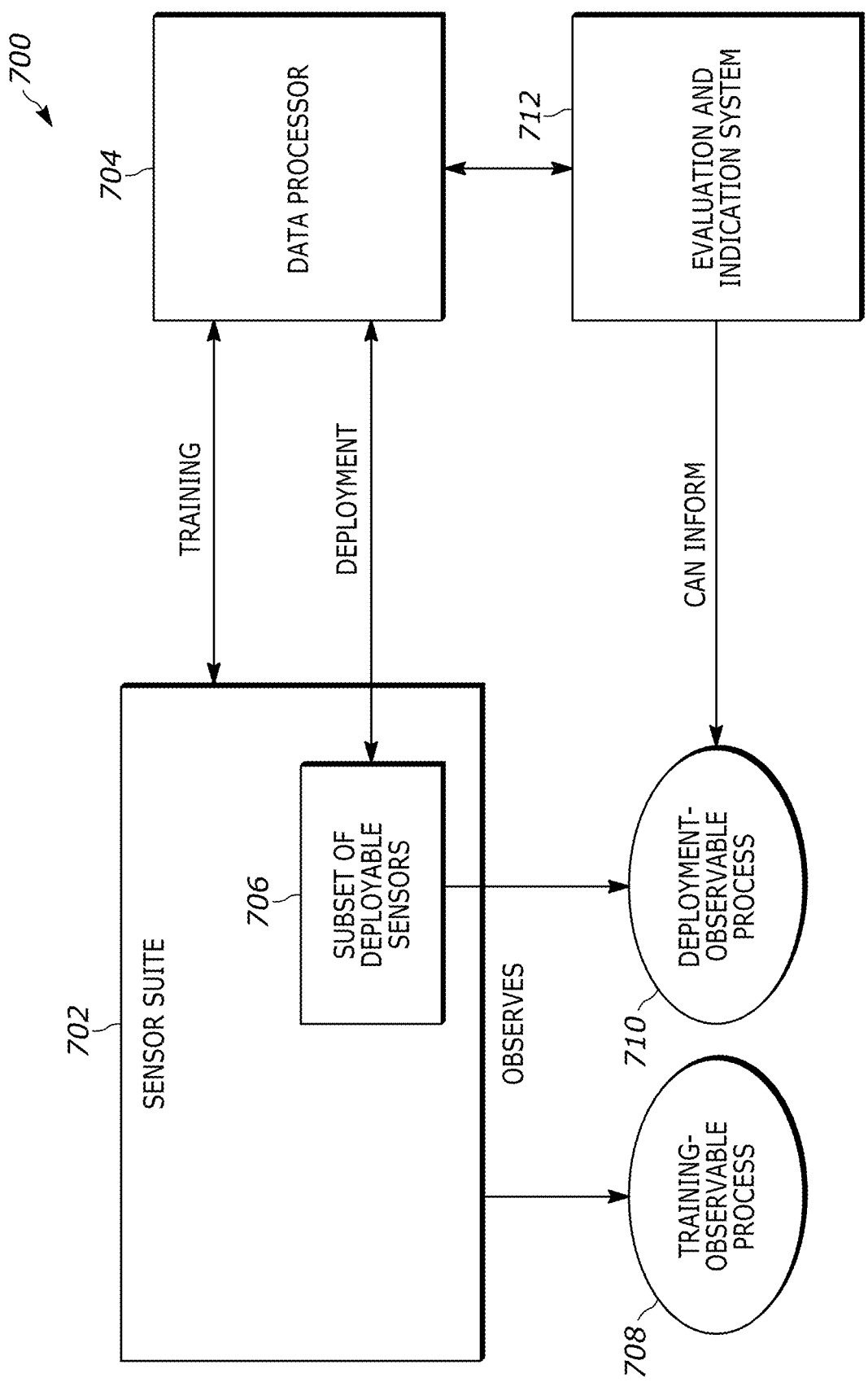
FIG. 7 is a block diagram of system for a virtual sensing system.

FIG. 7 is an overview of a general physical embodiment of a virtual sensing system. Sensor suite 702 consists of all the sensors available to the virtual sensing system. Example embodiments of the sensors in sensor suite 702 include optical, acoustic, vibrational, environmental, electromagnetic, and other sensors. The sensors in sensor suite 702 are those that can observe the process in the training state 708, e.g., in a laboratory. Sensor suite 702 therefore also includes sensors that cannot be easily deployed at scale, which are the sensors that will be virtually sensed. Data processor or controller 704 interacts with and controls sensor suite 702. Data processor 704 generally consists of some computing technology. Example embodiments of data processing systems include desktop computers, mobile computers, edge computers, mobile communications devices, mobility platforms such as vehicles or aircraft, security systems, and others. In addition to interacting with sensors, data processor 704 also analyzes data and implements core virtual sensing algorithms. A subset of sensor suite 702 is the set of deployable sensors 706. Deployable sensors 706 are those that can observe the process of interest in a scaled deployment 710 and are used as the source sensors enabling virtual sensing of the target or virtual sensors. In addition to data processor 704, an evaluation and indication system 712 interacts with both data processor 704 and the deployment-observable process 710 (and therefore also has access to data from sensors 702 and sensors 706. Evaluation system 712 is primarily used to observe the output of the virtual sensing occurring on data processor 704 to provide indications regarding the state of the observed process. Example non-limiting embodiments of evaluation system 712 can be a computationally-based system that uses data processing methods to understand the virtually sensed data perhaps based on prior knowledge or what has been previously observed, a machine learning algorithm that aims to classify the state of the process such as a support vector machine, decision tree, random forest, k-nearest neighbors, k-means, neural network, or other machine learning algorithm. The output from this classification may alert an artificial intelligence within evaluation system 712, data processor 704, or the process 710 itself to inform and justify subsequent decisions, e.g., change course, turn off a device, modify operating conditions, etc. Evaluation system 712 may also incorporate human involvement in which a human observes the outputs from data processor 704 or works with an automatic evaluation system to interpret the output from 704.

Many examples of real world embodiments of the system shown in FIG. 7 exist, and several examples will be discussed herein. However, those skilled in the art will recognize that, in general, the virtual sensing systems and methods disclosed herein can be applied to virtually any situation in which the objective is to acquire data from a difficult-to-deploy sensor via an easy-to-deploy sensor proxy, and the following examples exhibit several non-limiting examples of such situations such as shown in FIGS. 11-16.

Figure 8:
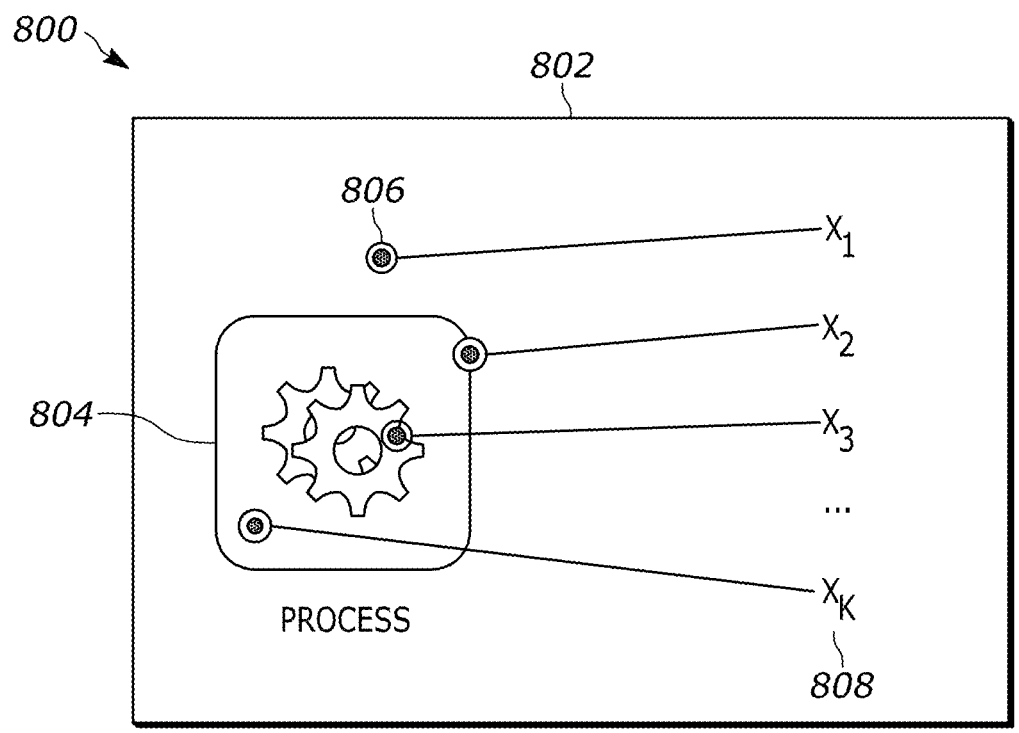
FIG. 8 is a graphical illustration of mathematical foundations of a virtual sensing system in relation to the physical system.

FIG. 8 illustrates the mathematical foundations 800 of the virtual sensing problem and how they relate to the physical embodiments described herein. System 802 includes process 804, which is the process of interest that is desired to observe via physical and/or virtual sensing domains. Sensors 806 represent all available sensors. The output from sensors 806 include all data X 808 including the subset of target sensor data, $X_\Omega$, $\Omega \subset \{1, \ldots, K\}$ and source sensor data, $X_\Lambda$, $\Lambda \subset \{1, \ldots, K\}$. An example embodiment of the virtual sensing problem is as follows. Let us assume, for example, that sensor data $X_1$ represents a source sensor that can be deployed while sensor $X_2$ represents a target sensor that cannot be deployed but can be tested in a test setup such that pairs of data $\{X_1(t), X_2(t)\}$ for time t can be acquired. The goal of virtual sensing is to find mapping function $f_\theta$ that maps $X_1$ to $X_2$ such that $X_2$ can be estimated even when the sensor typically used to acquire such data cannot be deployed. In the more general case, a desire to find mapping function $f_\theta$ 810, which maps $X_\Lambda$ to $X_\Omega$, i.e., $X_\Lambda = f_\theta(X_\Omega)$ for any $\Lambda, \Omega \subset \{1, \ldots, K\}$ where K represents the number of sensors. Under this formulation, the task may be to go from one source sensor to one target sensor, from one source sensor to multiple target sensors, from multiple source sensors to multiple target sensors, or multiple source sensors to one target sensor.

Figure 9:
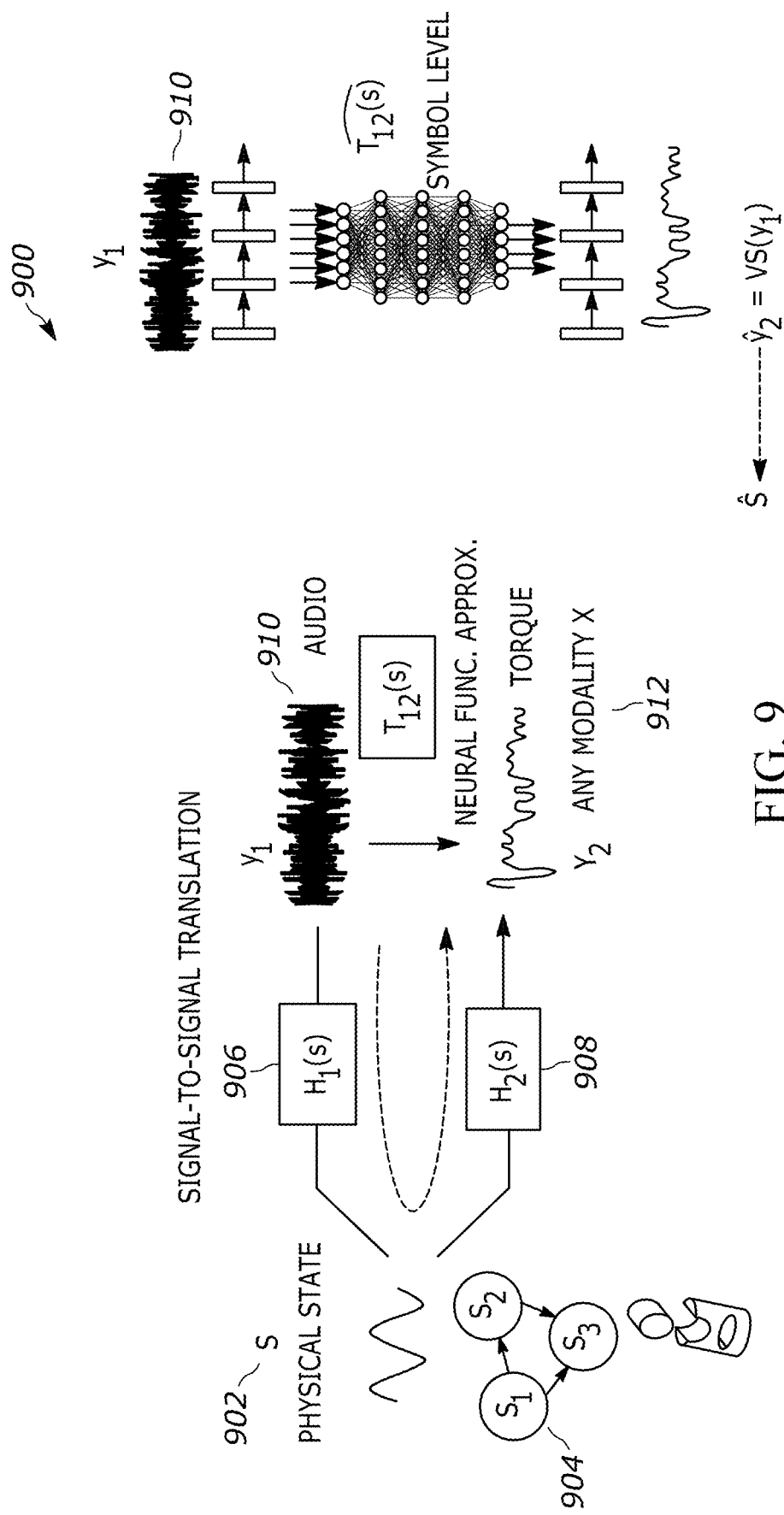
FIG. 9 is a graphical illustration of signal-to-signal translations via mapping target sensor data to source sensor data.

FIG. 9 illustrates the key idea behind virtual sensing via signal-to-signal translation. The sensing setup aims to estimate the hidden physical state of a linear or non-linear dynamical system S 902 where $S \in \{S_1, S_2, S_3 \ldots\}$ 904. The senor observations $y_1$ 910 and $y_2$ 912 can be considered to be the output of two observation models (transfer functions) $H_1(s)$ 906 and $H_2(s)$ 908 respectively. Both $y_1$ and $y_2$ encodes information about hidden state S in different manner depending on the properties of the observation models (i.e. $H_1(s)$ and $H_2(s)$). The key hypothesis of virtual sensing is that when $y_1$ and $y_2$ are acquired from the system underlying physical state S/phenomena, there must exist some mathematical relationship (linear or non-linear) between the two sensing modalities $y_1$ and $y_2$. The mathematical relationship represents the mutual information between the two sensing modalities $y_1$ and $y_2$ conditioned on S. This can be used to represent/approximate the mathematical relationship by a neural network model $T_{12}(s)$. Next is to train the neural network by collecting a large number of $y_1$-$y_2$ pairs by running the physical system through various states S. Under a practical deployment scenario, with $y_1$ as input, we can now estimate $y_2$ as an output of the trained neural network transfer function model (i.e., virtually sensing $y_2$ with no corresponding physical sensor available, rather, sensing/reconstruct $y_2$ "virtually" from physical available sensor/data $y_1$). The choice of $y_1$ and $y_2$ i.e. which sensor data is virtually sensed and which one is physically deployed depends on several factors/tradeoffs. For example, $y_2$ might be expensive and hard to deploy in a scalable manner while $y_1$ is cheap and easy to deploy while it might be easier to estimate physical state S (ultimate goal of sensing for downstream tasks) from $y_2$ i.e. $H_2(s)$ is in less complicated, better-posed. Under such scenarios, a system would deploy $y_1$ and virtually sense $y_2$ and then use $y_2$ data to arrive/estimate S to perform downstream tasks e.g., machine health monitoring/predictive diagnostics.

Figure 10:
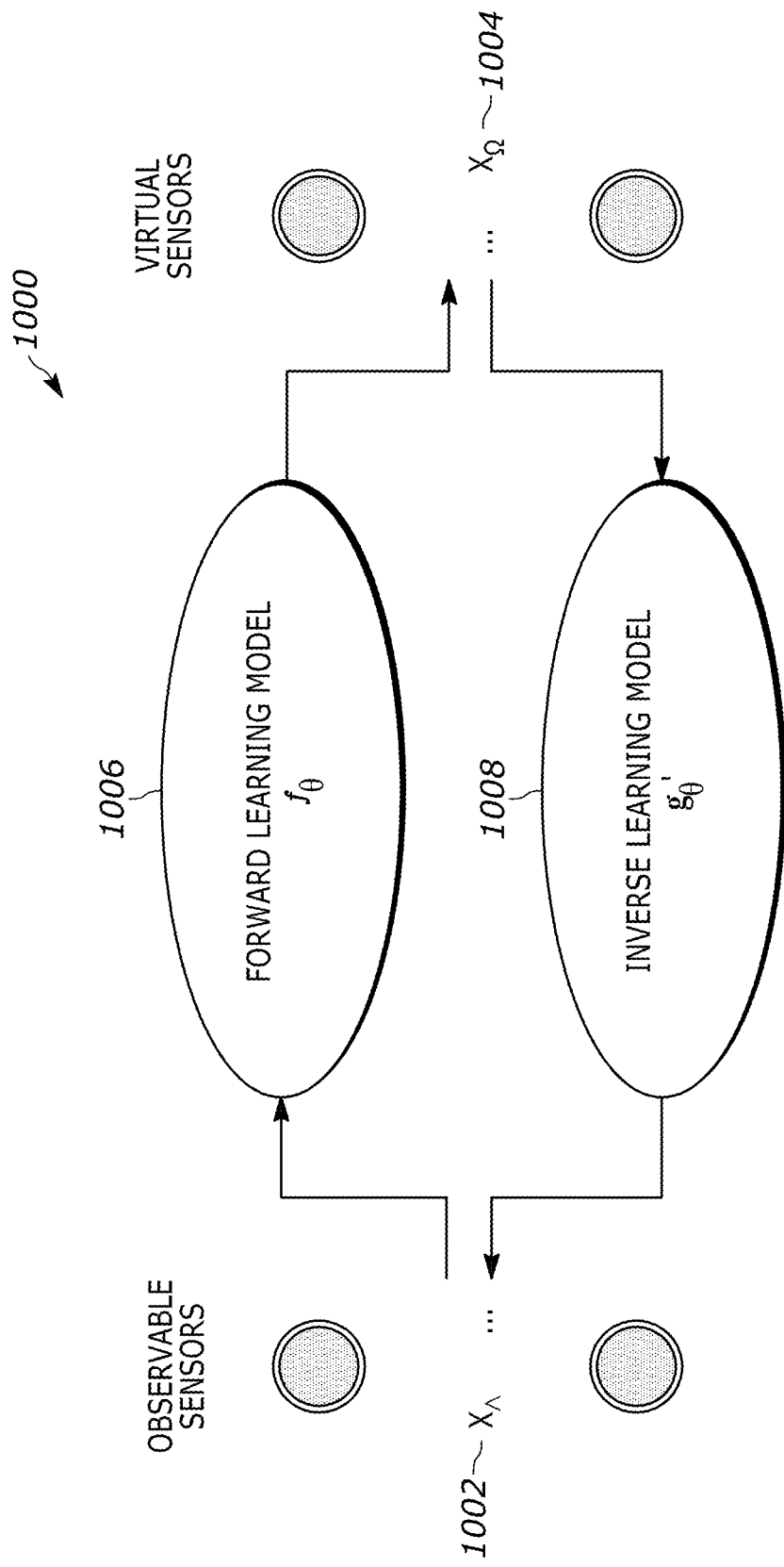
FIG. 10 is another graphical illustration of signal-to-signal translations via mapping target sensor data to source sensor data.

In addition to mapping source sensor data to target sensor data, it may also be important to be able to map target sensor data back to source sensor data. When testing the effectiveness of mapping function A in a test setup in which target sensor data can be acquired, the accuracy of such mapping function can be measured directly. However, when deployed in a setting in which target sensors cannot be deployed. FIG. 10 is a method 1000 of validating the virtually sensed data is to map the target virtual data back into the observable source domain. Observable sensors 1002 are mapped to virtual sensors 1004 via forward learning model 1006. Virtual sensors 1004 are mapped back to observable sensors 1002 via inverse learning model 1008 represented by function $g_{\theta'}$. Importantly, the inverse learning model can be developed at the same time as the forward learning model on real data from both the observable and virtual domains. Importantly and similarly to the forward map function $f_\theta$, the inverse mapping function $g_{\theta'}$ can map from all virtual sensor data to all observable sensor data, or any combination of subsets of both virtual data and observable data.

What follows is a mathematical formulation of a non-limiting embodiment of the virtual sensing algorithm and training process used in conjunction with the other methods and systems in this disclosure to estimate data from virtual sensors of interest. Let us first consider a physical process monitored by a set of K sensors and let $X_i$ denote the data acquired by the $i^{th}$ sensor. The data $X_i$ could correspond to unprocessed data from the sensor, processed data (e.g. filtering, normalization, computation of spectrum or spectrogram, etc.), a composition of different data processing methods, or a combination of these data. Let us next consider the problem of estimation of the measurements of the target data from the measurements of the source data. To solve the problem of estimating $X_\Omega$ from $X_\Lambda$, one can learn a mapping function $f_\theta$ parameterized by parameters $\theta$ such that the minimization of a reconstruction loss L is achieved via $$\underset{\theta}{\operatorname{argmin}} L(X_\Omega, f_\theta(X_\Lambda)). \quad (15)$$

Next denote $\hat{X}_\Omega = f_\theta(X_\Lambda)$ to be virtual sensor measurements. Instead of measuring the phenomena with sensors $\Omega$ to obtain non-virtual measurements $X_\Omega$, obtain virtual measurements by measuring the phenomena with sensors A and applying a mapping function $f_\theta$ to such measurements in $X_\Lambda$. One example, non-limiting embodiment of the reconstruction loss L is an $\ell_p$-norm, which calculates difference between the real sensor measurements $X_\Omega$ and the virtual sensor measurements $\hat{X}_\Omega$. The value of p can be defined based on problem requirements and or specifications or by using expert knowledge. Furthermore, in a situation where the reconstruction of either one specific sensor or a set of specific sensors is of greater importance than all the target sensors, the reconstruction loss L can be adapted to take that into account and prioritize certain sensors. For example, using a weighted norm of the difference wherein the relative importance of sensor reconstruction is conveyed via the weights of the norm.

In order to validate the virtual sensing accuracy of mapping function $f_\theta$, it may be useful to be also able to map from the virtual sensing domain back into the non-virtual domain. During the process of learning parameters $\theta$ that parameterize the function $f$ that maps from source sensor data to target sensor data, it is also possible to learn parameters $\theta'$ of an inverse mapping function g that maps from the target sensor data to the source sensor data. This joint learning process of $\theta$ and $\theta'$ can be formulated as $$\underset{\theta,\theta'}{\operatorname{argmin}} L(X_\Omega, f_\theta(X_\Lambda)) + \tau L(X_\Lambda, g_{\theta'}(X_\Omega)). \quad (16)$$

The composition of the two mapping functions $f$ and g allows for an estimation of the reconstruction of the virtual sensing $\hat{X}_\Omega$ without explicit knowledge of the measurements of the target sensor $X_\Omega$. Next, let $\gamma(\theta, X_\gamma) \propto L'(g'_\theta(f'_\theta(X_\Lambda)), X_\lambda)$ where L' denotes a reconstruction loss. The quality of the estimation of the reconstruction $\gamma$ can also be a part of the joint learning process of $\theta$ and $\theta'$ where, in addition to learning the mappings, the parameters $\theta$ and $\theta'$ are optimized such that $\gamma$ is an accurate indicator of the reconstruction error given by $$\underset{\theta,\theta'}{\operatorname{argmin}} L(X_\Omega, f_\theta(X_\Lambda)) + \tau L(X_\Lambda, g_{\theta'}(X_\Omega)) + L'(g'_\theta(f'_\theta(X_\Lambda)), X_\lambda). \quad (17)$$

This additional consideration on the process of learning the parameters for the mappings (from source to target and from target to source) is an important concept regarding the robustness of the mappings. This is useful for situations in which the virtual sensors of interest can never be deployed as non-virtual sensors or they cannot be deployed at scale.

A particular mapping can be regarded as robust if imperceptible changes $\delta$ applied to the input of the mapping functions do not result in perceptible changes to the output of the mapping functions. More formally, this corresponds to a bounding given by $$\underset{\delta \in \Delta}{\max} \|f(x+\delta) - f(x)\|_2^2 / \|\delta\|_2^2 \quad (18)$$

$$\underset{\delta \in \Delta}{\max} \|g(x+\delta) - g(x)\|_2^2 / \|\delta\|_2^2 \quad (19)$$

where $\Delta$ denotes a space of admissible perturbations (e.g. $\ell_p$ ball of radius $\epsilon$). In addition to the approximation of the virtual sensor measurements to the real sensor measurements (minimization of the loss function L), the parameters of the mapping functions $f$ and g can also take into account the minimization of these bounds. Let $$R_\theta(X_\Lambda) = E_{x \sim X_\Lambda} \left[ \underset{\delta \in \Delta}{\max} \|f_\theta(x+\delta) - f_\theta(x)\|_2^2 / \|\delta\|_2^2 \right] \quad (20)$$

$$R_{\theta'}(X_\Omega) = E_{x \sim X_\Omega} \left[ \underset{\delta \in \Delta}{\max} \|g_{\theta'}(x+\delta) - g_{\theta'}(x)\|_2^2 / \|\delta\|_2^2 \right] \quad (21)$$

denote the measurements of robustness of the mapping functions. Including these measurements of robustness as regularizers to the optimization problem at hand allows for training a model that is, at least, robust to perturbations on the train data. The problem of learning $\theta$ and $\theta'$ can thus be posed as $$\underset{\theta,\theta'}{\operatorname{argmin}} L(X_\Omega, f_\theta(X_\Lambda)) + \quad (22)$$

$$\tau_1 L(X_\Lambda, g_{\theta'}(X_\Omega)) + \tau_2 \gamma + \tau_3 R_\theta(X_\Lambda) + \tau_4 R'_\theta(X_\Omega).$$

Many embodiments of the mapping functions $f$ and g exist and can be parametrized by a variety of algorithms and methods. Example embodiments of methods for acquiring these functions and their parameters include regression, principal component analysis, singular-value decomposition, canonical correlation analysis, sequence-to-sequence modeling methods and multi-modal representation methods, artificial neural networks, deep neural networks, convolutional neural networks, recurrent neural networks, U-nets, combinations and compositions of these methods, and many others. One example set of preferred embodiments of the mapping functions $f$ and g are generative models, and, more specifically, as variational autoencoders. In this case, each mapping function is composed of an encoder and a decoder. The encoder component of $f$ receives as input $X_\Lambda$ and outputs the parameters of a Gaussian distribution parameterized by $\mu_{f\theta}, \Sigma_{f\theta}$. From this distribution, a latent vector $z_f$ is sampled and is provided as an input to the decoder portion of $f$, which outputs $X_\Omega$. Conversely, the encoder component of g receives $X_\Omega$ as an input and outputs parameters of a Gaussian distribution parameterized by $\mu_{g\theta}, \Sigma_{g\theta}$. From this distribution a latent vector $z_g$ is sampled and can then be provided as input to the decoder component of g, which outputs $X_\Lambda$.

Learning the parameters of the generative models, i.e., of the encoder and decoder, can be performed by minimizing the loss function L, which measures the difference between the real target sensor measurements and the virtual target sensor measurements, and a divergence measure between the distributions obtained by the encoder and a prior distribution (e.g. Gaussian with zero mean and identity covariance).

Learning the mappings $f$ and $g$ using variational autoencoders can be a separate or joint process. For the situation in which the mappings are learned separately, the parameters of the encoder-decoder pair for $f$ and $g$ are independently learned. For the situation in which the mappings are learned jointly, and jointly learn the parameters of the encoder-decoder pair for $f$ and $g$ in which the encoder for $f$ is the inverse of the decoder for $g$ and the decoder for $f$ is the inverse of the encoder for $g$. One method of implementing this process is by imposing similarity of the distributions $\mu_{f\theta}$, $\Sigma_{f\theta}$ and $\mu_{g\theta}$, $\Sigma_{g\theta}$ (e.g. through the minimization of the $_{divergence}$ between these two distributions).

Figure 11:
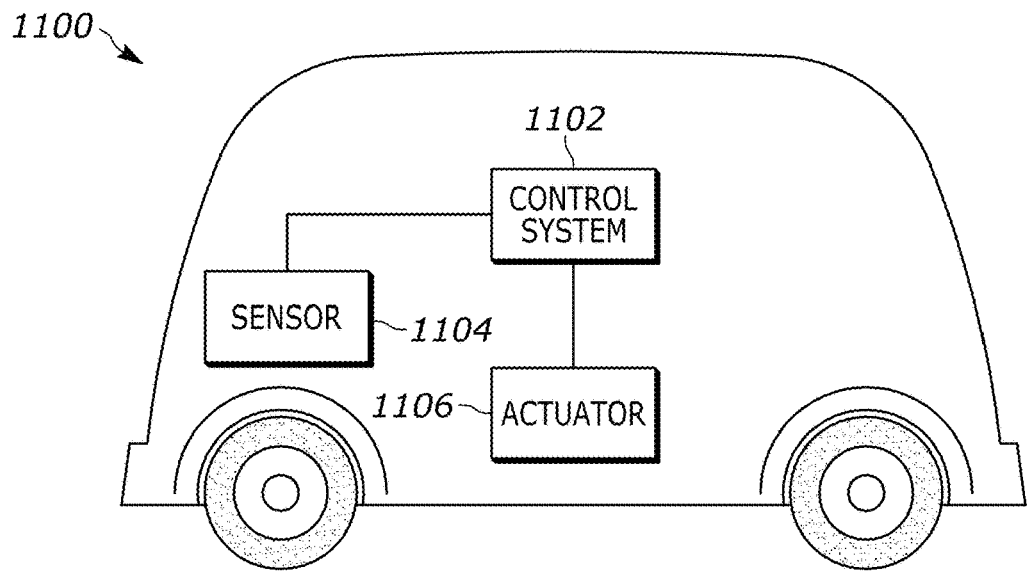
FIG. 11 is a schematic diagram of a control system configured to control a vehicle.

FIG. 11 is a schematic diagram of control system 1102 configured to control a vehicle, which may be an at least partially autonomous vehicle or an at least partially autonomous robot. The vehicle includes a sensor 1104 and an actuator 1106. The sensor 1104 may include one or more visual light based sensor (e.g., a Charge Coupled Device CCD, or video), radar, LiDAR, microphone array, ultrasonic, infrared, thermal imaging, acoustic imaging or other technologies (e.g., positioning sensors such as GPS). One or more of the one or more specific sensors may be integrated into the vehicle. Alternatively or in addition to one or more specific sensors identified above, the control module 1102 may include a software module configured to, upon execution, determine a state of actuator 1104. One non-limiting example of a software module includes a weather information software module configured to determine a present or future state of the weather proximate the vehicle or other location.

In embodiments in which the vehicle is an at least a partially autonomous vehicle, actuator 1106 may be embodied in a brake system, a propulsion system, an engine, a drivetrain, or a steering system of the vehicle. Actuator control commands may be determined such that actuator 1106 is controlled such that the vehicle avoids collisions with detected objects. Detected objects may also be classified according to what the classifier deems them most likely to be, such as pedestrians or trees. The actuator control commands may be determined depending on the classification. For example, control system 1102 may segment an image (e.g., optical, acoustic, thermal) or other input from sensor 1104 into one or more background classes and one or more object classes (e.g. pedestrians, bicycles, vehicles, trees, traffic signs, traffic lights, road debris, or construction barrels/cones, etc.), and send control commands to actuator 1106, in this case embodied in a brake system or propulsion system, to avoid collision with objects. In another example, control system 1102 may segment an image into one or more background classes and one or more marker classes (e.g., lane markings, guard rails, edge of a roadway, vehicle tracks, etc.), and send control commands to actuator 1106, here embodied in a steering system, to cause the vehicle to avoid crossing markers and remain in a lane. In a scenario where an adversarial attack may occur, the system described above may be further trained to better detect objects or identify a change in lighting conditions or an angle for a sensor or camera on the vehicle.

In other embodiments where vehicle 1100 is an at least partially autonomous robot, vehicle 1100 may be a mobile robot that is configured to carry out one or more functions, such as flying, swimming, diving and stepping. The mobile robot may be an at least partially autonomous lawn mower or an at least partially autonomous cleaning robot. In such embodiments, the actuator control command 1106 may be determined such that a propulsion unit, steering unit and/or brake unit of the mobile robot may be controlled such that the mobile robot may avoid collisions with identified objects.

In another embodiment, vehicle 1100 is an at least partially autonomous robot in the form of a gardening robot. In such embodiment, vehicle 1100 may use an optical sensor as sensor 1104 to determine a state of plants in an environment proximate vehicle 1100. Actuator 1106 may be a nozzle configured to spray chemicals. Depending on an identified species and/or an identified state of the plants, actuator control command 1102 may be determined to cause actuator 1106 to spray the plants with a suitable quantity of suitable chemicals.

Vehicle 1100 may be an at least partially autonomous robot in the form of a domestic appliance. Non-limiting examples of domestic appliances include a washing machine, a stove, an oven, a microwave, or a dishwasher. In such a vehicle 1100, sensor 1104 may be an optical or acoustic sensor configured to detect a state of an object which is to undergo processing by the household appliance. For example, in the case of the domestic appliance being a washing machine, sensor 1104 may detect a state of the laundry inside the washing machine. Actuator control command may be determined based on the detected state of the laundry.

In this embodiment, the control system 1102 would receive image (optical or acoustic) and annotation information from sensor 1104. Using these and a prescribed number of classes k and similarity measure $\overline{K}$ that are stored in the system, the control system 1102 may use the method described in FIG. 10 to classify each pixel of the image received from sensor 1104. Based on this classification, signals may be sent to actuator 1106, for example, to brake or turn to avoid collisions with pedestrians or trees, to steer to remain between detected lane markings, or any of the actions performed by the actuator 1106 as described above. Signals may also be sent to sensor 1104 based on this classification, for example, to focus or move a camera lens.

Figure 12:
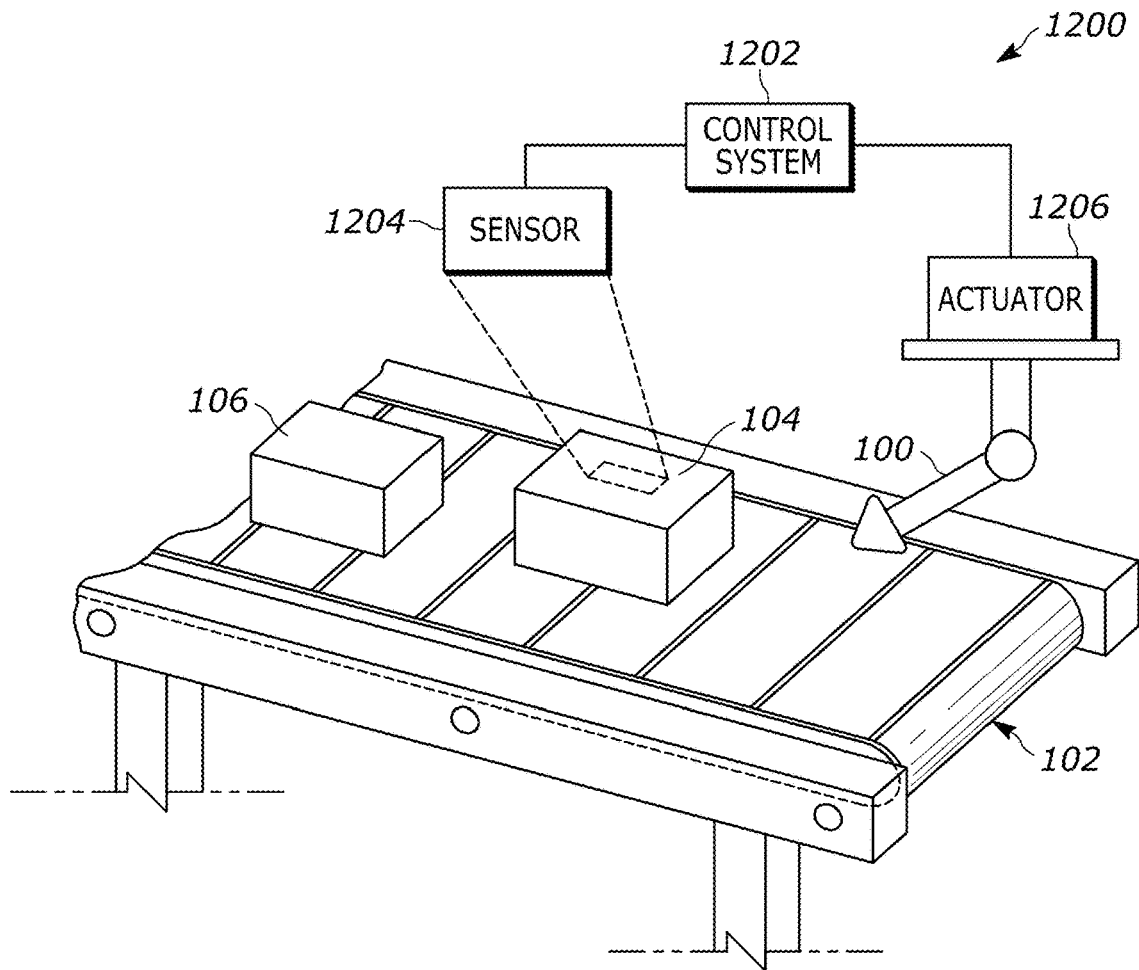
FIG. 12 is a schematic diagram of a control system configured to control a manufacturing machine.

FIG. 12 depicts a schematic diagram of control system 1202 configured to control system 1200 (e.g., manufacturing machine), such as a punch cutter, a cutter or a gun drill, of manufacturing system 102, such as part of a production line. Control system 1202 may be configured to control actuator 14, which is configured to control system 100 (e.g., manufacturing machine).

Sensor 1204 of system 1200 (e.g., manufacturing machine) may be an optical or acoustic sensor or sensor array configured to capture one or more properties of a manufactured product. Control system 1202 may be configured to determine a state of a manufactured product from one or more of the captured properties. Actuator 1206 may be configured to control system 1202 (e.g., manufacturing machine) depending on the determined state of manufactured product 104 for a subsequent manufacturing step of the manufactured product. The actuator 1206 may be configured to control functions of FIG. 11 (e.g., manufacturing machine) on subsequent manufactured products of the system (e.g., manufacturing machine) depending on the determined state of the previous manufactured product.

In this embodiment, the control system 1202 would receive image (e.g., optical or acoustic) and annotation information from sensor 1204. Using these and a prescribed number of classes k and similarity measure $\overline{K}$ that are stored in the system, the control system 1202 may use the method described in FIG. 10 to classify each pixel of the image received from sensor 1204, for example, to segment an image of a manufactured object into two or more classes, to detect anomalies in the manufactured product, to ensure the presence of objects on the manufactured product such as barcodes. Based on this classification, signals may be sent to actuator 1206. For example, if control system 1202 detects anomalies in a product, actuator 1206 may mark or remove anomalous or defective products from the line. In another example, if control system 1202 detects the presence of barcodes or other objects to be placed on the product, actuator 1106 may apply these objects or remove them. Signals may also be sent to sensor 1204 based on this classification, for example, to focus or move a camera lens.

Figure 13:
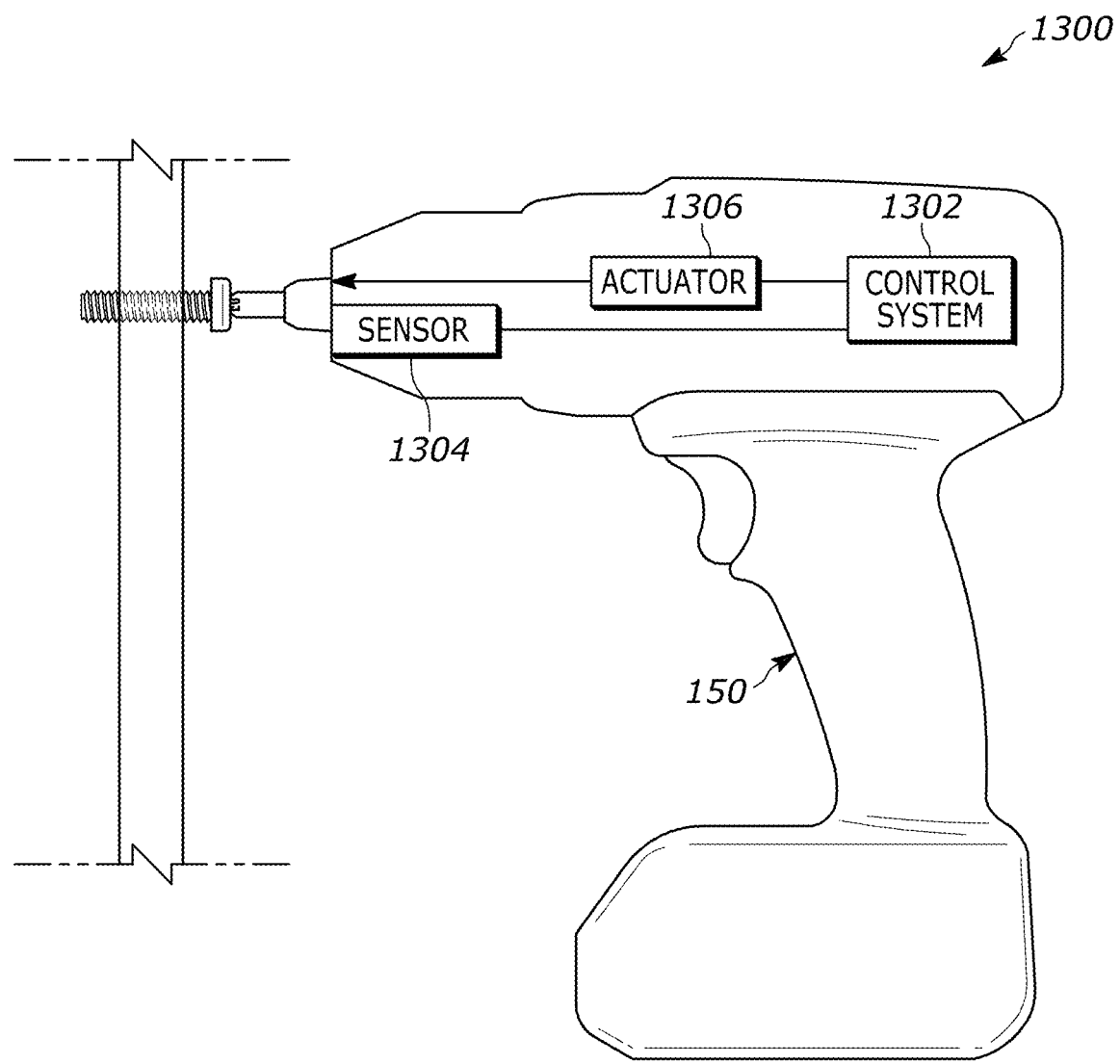
FIG. 13 is a schematic diagram of a control system configured to control a power tool.

FIG. 13 depicts a schematic diagram of control system 1302 configured to control power tool 1300, such as a power drill or driver, that has an at least partially autonomous mode. Control system 1302 may be configured to control actuator 1306, which is configured to control power tool 1300.

Sensor 1304 of power tool 1300 may be an optical or acoustic sensor configured to capture one or more properties of a work surface and/or fastener being driven into the work surface. Control system 1302 may be configured to determine a state of work surface and/or fastener relative to the work surface from one or more of the captured properties.

In this embodiment, the control system 1302 would receive image (e.g., optical or acoustic) and annotation information from sensor 1304. Using these and a prescribed number of classes k and similarity measure $\overline{K}$ that are stored in the system, the control system 1302 may use the method described in FIG. 10 to classify each pixel of the image received from sensor 1304 in order to segment an image of a work surface or fastener into two or more classes or to detect anomalies in the work surface or fastener. Based on this classification, signals may be sent to actuator 1306, for example to the pressure or speed of the tool, or any of the actions performed by the actuator 1306 as described in the above sections. Signals may also be sent to sensor 1304 based on this classification, for example, to focus or move a camera lens. In another example, the image may be a time series image of signals from the power tool 1300 such as pressure, torque, revolutions per minute, temperature, current, etc. in which the power tool is a hammer drill, drill, hammer (rotary or demolition), impact driver, reciprocating saw, oscillating multi-tool, and the power tool is either cordless or corded.

Figure 14:
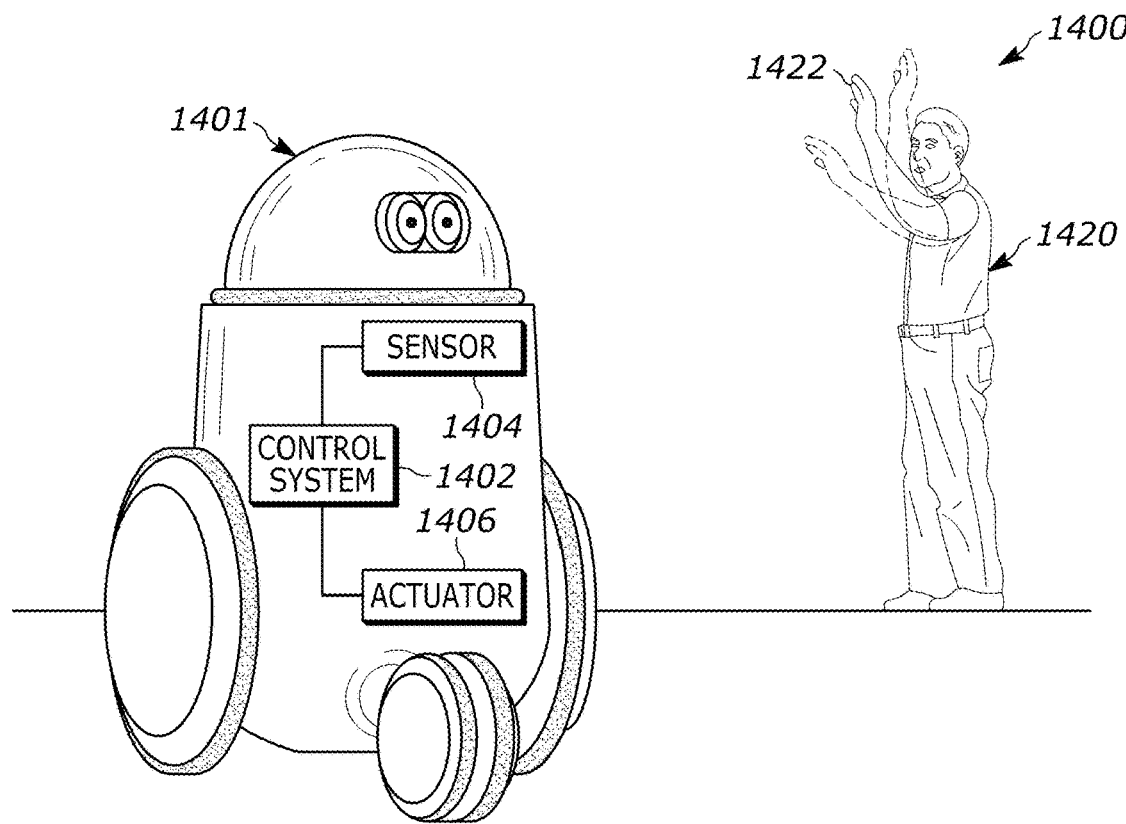
FIG. 14 is a schematic diagram of a control system configured to control an automated personal assistant.

FIG. 14 depicts a schematic diagram of control system 1402 configured to control automated personal assistant 1401. Control system 1402 may be configured to control actuator 1406, which is configured to control automated personal assistant 1401. Automated personal assistant 1401 may be configured to control a domestic appliance, such as a washing machine, a stove, an oven, a microwave or a dishwasher.

In this embodiment, the control system 1402 would receive image (e.g., optical or acoustic) and annotation information from sensor 1404. Using these and a prescribed number of classes k and similarity measure $\overline{K}$ that are stored in the system, the control system 1402 may use the method described in FIG. 10 to classify each pixel of the image received from sensor 1404, for example, to segment an image of an appliance or other object to manipulate or operate. Based on this classification, signals may be sent to actuator 1406, for example, to control moving parts of automated personal assistant 1401 to interact with domestic appliances, or any of the actions performed by the actuator 1406 as described in the above sections. Signals may also be sent to sensor 1404 based on this classification, for example, to focus or move a camera lens.

Figure 15:
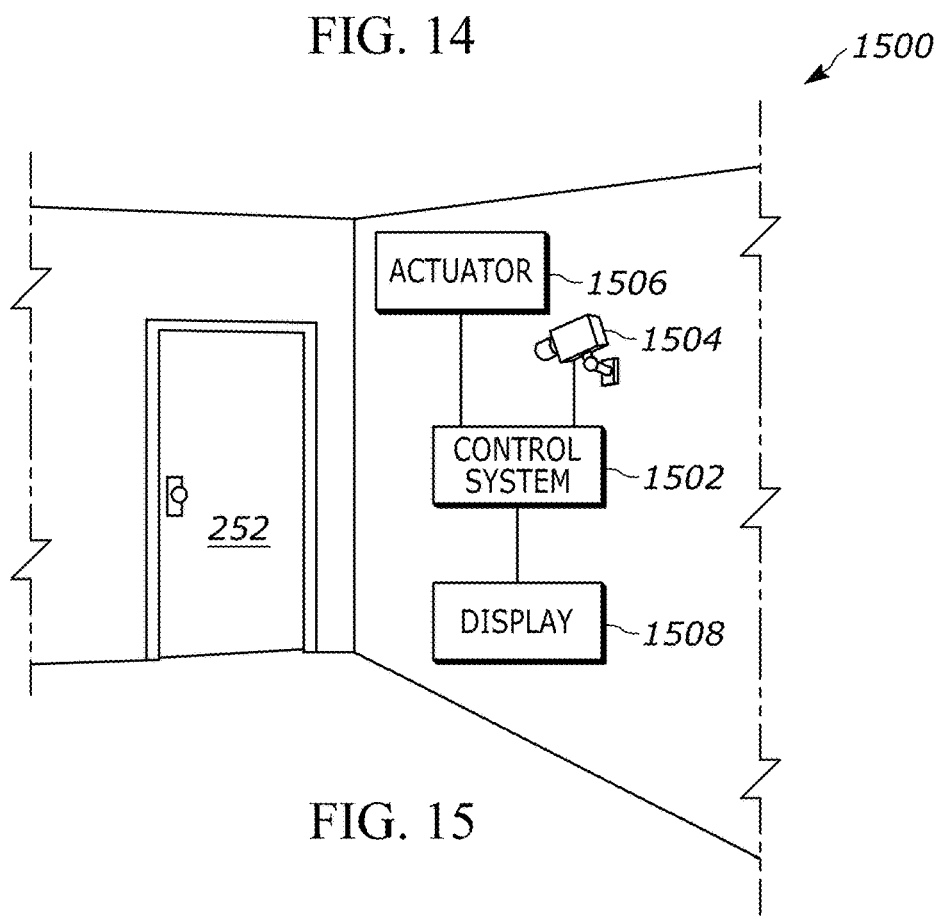
FIG. 15 is a schematic diagram of a control system configured to control a monitoring system.

FIG. 15 depicts a schematic diagram of control system 1502 configured to control monitoring system 1500. Monitoring system 1500 may be configured to physically control access through door 252. Sensor 1504 may be configured to detect a scene that is relevant in deciding whether access is granted. Sensor 1504 may be an optical or acoustic sensor or sensor array configured to generate and transmit image and/or video data. Such data may be used by control system 1502 to detect a person's face.

Monitoring system 1500 may also be a surveillance system. In such an embodiment, sensor 1504 may be an optical sensor configured to detect a scene that is under surveillance and control system 1502 is configured to control display 1508. Control system 1502 is configured to determine a classification of a scene, e.g. whether the scene detected by sensor 1504 is suspicious. A perturbation object may be utilized for detecting certain types of objects to allow the system to identify such objects in non-optimal conditions (e.g., night, fog, rainy, interfering background noise etc.). Control system 1502 is configured to transmit an actuator control command to display 1508 in response to the classification. Display 1508 may be configured to adjust the displayed content in response to the actuator control command. For instance, display 1508 may highlight an object that is deemed suspicious by controller 1502.

In this embodiment, the control system 1502 would receive image (optical or acoustic) and annotation information from sensor 1504. Using these and a prescribed number of classes k and similarity measure $\overline{K}$ that are stored in the system, the control system 1502 may use the method described in FIG. 10 to classify each pixel of the image received from sensor 1504 in order to, for example, detect the presence of suspicious or undesirable objects in the scene, to detect types of lighting or viewing conditions, or to detect movement. Based on this classification, signals may be sent to actuator 1506, for example, to lock or unlock doors or other entryways, to activate an alarm or other signal, or any of the actions performed by the actuator 1506 as described in the above sections. Signals may also be sent to sensor 1504 based on this classification, for example, to focus or move a camera lens.

Figure 16:
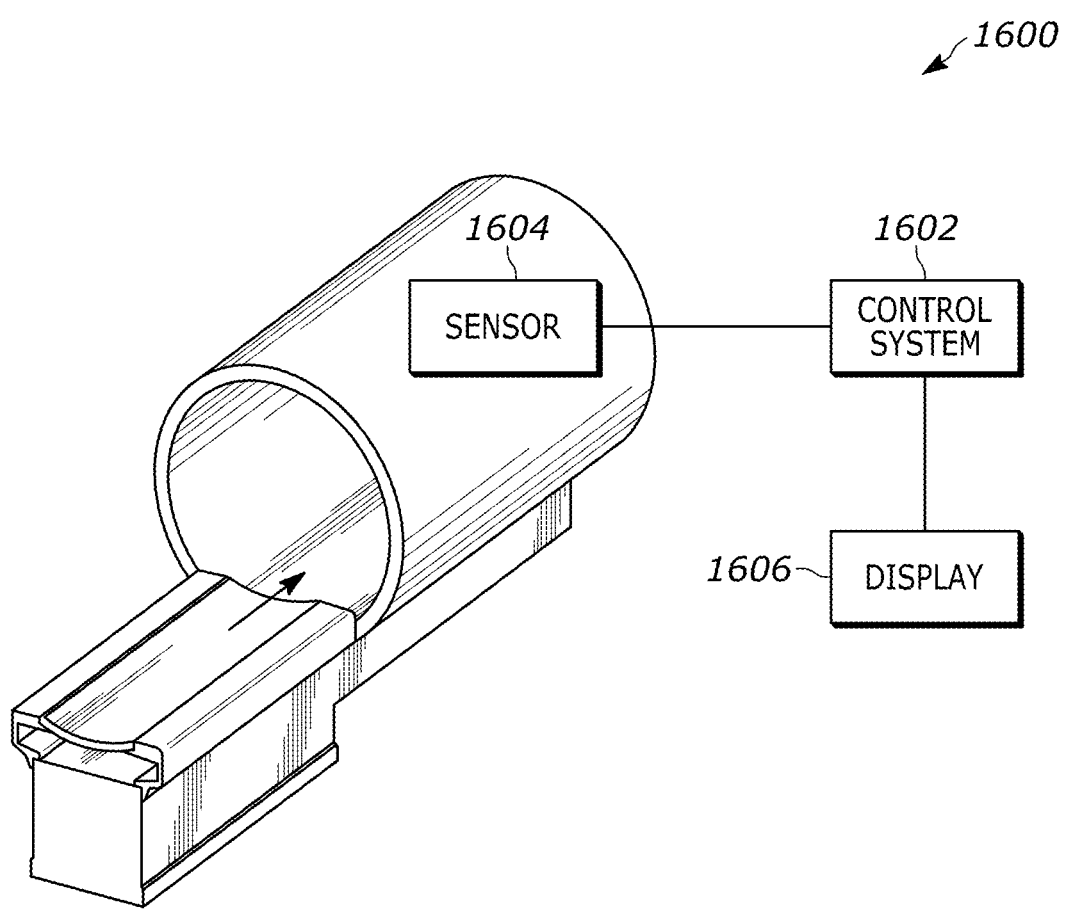
FIG. 16 is a schematic diagram of a control system configured to control a medical imaging system.

FIG. 16 depicts a schematic diagram of control system 1602 configured to control imaging system 1600, for example an MRI apparatus, x-ray imaging apparatus or ultrasonic apparatus. Sensor 1604 may, for example, be an imaging sensor or acoustic sensor array. Control system 1602 may be configured to determine a classification of all or part of the sensed image. Control system 1602 may be configured to determine or select an actuator control command in response to the classification obtained by the trained neural network. For example, control system 1602 may interpret a region of a sensed image (optical or acoustic) to be potentially anomalous. In this case, the actuator control command may be determined or selected to cause display 1606 to display the imaging and highlighting the potentially anomalous region.

In this embodiment, the control system 1602 would receive image and annotation information from sensor 1604. Using these and a prescribed number of classes k and similarity measure $\overline{K}$ that are stored in the system, the control system 1602 may use the method described in FIG. 10 to classify each pixel of the image received from sensor 1604. Based on this classification, signals may be sent to actuator 1606, for example, to detect anomalous regions of the image or any of the actions performed by the actuator 1606 as described in the above sections.

The program code embodying the algorithms and/or methodologies described herein is capable of being individually or collectively distributed as a program product in a variety of different forms. The program code may be distributed using a computer readable storage medium having computer readable program instructions thereon for causing a processor to carry out aspects of one or more embodiments. Computer readable storage media, which is inherently non-transitory, may include volatile and non-volatile, and removable and non-removable tangible media implemented in any method or technology for storage of information, such as computer-readable instructions, data structures, program modules, or other data. Computer readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. Computer readable program instructions may be downloaded to a computer, another type of programmable data processing apparatus, or another device from a computer readable storage medium or to an external computer or external storage device via a network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions, acts, and/or operations specified in the flowcharts or diagrams. In certain alternative embodiments, the functions, acts, and/or operations specified in the flowcharts and diagrams may be re-ordered, processed serially, and/or processed concurrently consistent with one or more embodiments. Moreover, any of the flowcharts and/or diagrams may include more or fewer nodes or blocks than those illustrated consistent with one or more embodiments.

While all of this disclosure has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. This disclosure in its broader aspects is therefore not limited to the specific details, representative apparatus and method, and illustrative examples shown and described. Accordingly, departures may be made from such details without departing from the spirit or scope of the general inventive concept.

What is claimed is:

1. A mobile robotic platform for data acquisition comprising:
    a transceiver within the mobile robotic platform;
    a locomotion unit configured to move the mobile robotic platform within an area;
    a sensor coupled with the locomotion unit and configured to output a signal including background noise, distortions, and foreground signals of interest; and
    a controller configured to,
    request a measurement of a parameter from the sensor associated with a position and direction of the mobile robotic platform,
    store the measurement and the position and direction of the mobile robotic platform within the area,
    request the locomotion unit to move the mobile robotic platform within the area to a new position and direction,
    in response to the locomotion unit moving the mobile robotic platform to the new position and direction, request a second measurement of the parameter from the sensor associated with the new position and direction of the mobile robotic platform,
    spatially aggregate signals from the sensor and associated position and direction of the mobile robotic platform within the area to create an energy map via spatio-dynamic beamforming, wherein the energy map is indicative of signal intensity as a function of spatial dimensions, and wherein the background noise and distortions are reduced, by spatially averaging spatio-dynamic beamformed information acquired across multiple locations to synthesize signals indicative of the foreground signals of interest, and
    analyze the energy map to identify a state of an apparatus in the area, wherein the map includes information indicative of acoustic changes or electromagnetic energy over time, overlay a foreground beamformed image captured at a point in time with previous in time foreground beamformed images to indicate a change in the foreground beamformed images with respect to time, such that the controller aggregates the signal temporally and spatially, and outputs an alert when a magnitude of the change is above a threshold.

2. The mobile robotic platform of claim 1, wherein the controller is further configured to, as a number of positions at which the signal is spatially aggregated increases, decrease an impact of the background noise and distortion such that the measurement approaches the foreground signal of interest.

3. The mobile robotic platform of claim 1, wherein the sensor is an array of sensors.

4. The mobile robotic platform of claim 1, wherein the sensor is a gyroscope, vision sensor, audible acoustic sensor, ultrasonic acoustic sensor, Inertial Measurement Unit, or accelerometer.

5. The mobile robotic platform of claim 1, wherein the locomotion unit is an airborne drone, wheeled robot, or submersible platform.

6. The mobile robotic platform of claim 1, wherein the locomotion unit is a mechanical arm that is mounted at a location and configured to traverse the area around the apparatus.

7. A system for imaging a room comprising:
    a mobile platform configured to move within the room;
    a sensor coupled with the mobile platform and configured to measure a parameter within an area relative to the sensor and output a signal having background noise, distortions, and a foreground signal of interest associated with the parameter within the area; and
    a controller configured to,
    request a measurement of the parameter from the sensor associated with a position of the mobile platform and a direction of the mobile platform,
    store the measurement and the position and direction of the mobile platform within the room, move the mobile platform within the room to a new position, in response to the mobile platform reaching the new position, request a second measurement of the parameter from the sensor associated with the new position of the mobile platform and direction of the mobile platform, spatially aggregate the signal from the sensor and associated position and direction of the mobile platform within the room to create an energy map via spatio-dynamic beamforming, wherein the background noise and distortions are reduced, by spatially averaging beamformed information acquired across multiple locations to synthesize signals indicative of the foreground signal of interest, wherein the energy map includes acoustic information associated with spatial locations recorded, analyze the energy map to identify a status of an apparatus in the room, and output a foreground beamformed image, wherein the foreground beamformed image is overlaid with previous in time foreground beamformed images to indicate a change in the foreground beamformed images with respect to time.

8. The system of claim 7, wherein the sensor articulates relative to the mobile platform.

9. The system of claim 7, wherein the foreground beamformed image is 3-dimensional intensity map.

10. The system of claim 7, wherein the controller to output an alert if a magnitude of the change is above a threshold.

11. The system of claim 7, wherein the parameter is sound and the sensor is a microphone.

12. The system of claim 7, wherein the parameter is electromagnetic energy and the sensor is a RF receiver, CCD, photo diode, IR receiver, other EM sensors.

13. A method for imaging a room comprising:
by a controller:
requesting a signal, indicative of a measurement of a parameter, from a sensor associated with a position and direction of a mobile platform in the room, wherein the measurement from the sensor includes background noise, distortions, and a foreground signal of interest;

storing the measurement, position and direction of the mobile platform within the room;

requesting the mobile platform to move to a new position within the room;

in response to the mobile platform reaching the new position, requesting a second measurement of the parameter from the sensor associated with the new position and direction of the mobile platform at the new position;

spatially aggregating the signal from the sensor and associated position and direction of the mobile platform within the room to create an energy map via spatio-dynamic beamforming, wherein the background noise and distortions are reduced, by spatially averaging beamformed information acquired across multiple locations to synthesize signals indicative of the foreground signal of interest, wherein the energy map includes acoustic information associated with spatial locations recorded;

analyzing the energy map to identify a state of an apparatus in the room;

outputting a foreground beamformed image, wherein overlaying the foreground beamformed image with previous in time foreground beamformed images indicates a change in the foreground beamformed images with respect to time.

14. The method of claim 13, further comprising outputting an alert if a magnitude of the change is above a threshold.

15. The method of claim 14, wherein the parameter is sound and the sensor is a microphone.

16. The method of claim 14, wherein the parameter is electromagnetic energy and the sensor is a RF receiver, CCD, photo diode, IR receiver, other EM sensors.

17. The method of claim 14, wherein the foreground beamformed image is 3-dimensional intensity map.

* * * * *